(12) United States Patent
Feng

(10) Patent No.: US 12,189,951 B2
(45) Date of Patent: Jan. 7, 2025

(54) BEST READ REFERENCE VOLTAGE SEARCH OF 3D NAND MEMORY

(71) Applicant: Yangtze Memory Technologies Co., Ltd., Hubei (CN)

(72) Inventor: Yufei Feng, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 161 days.

(21) Appl. No.: 18/156,546

(22) Filed: Jan. 19, 2023

(65) Prior Publication Data
US 2024/0201853 A1 Jun. 20, 2024

Related U.S. Application Data

(63) Continuation of application No. PCT/CN2022/138853, filed on Dec. 14, 2022.

(51) Int. Cl.
*G06F 3/06* (2006.01)
*G11C 5/06* (2006.01)
(Continued)

(52) U.S. Cl.
CPC ............ *G06F 3/061* (2013.01); *G06F 3/0679* (2013.01); *G11C 5/063* (2013.01);
(Continued)

(58) Field of Classification Search
CPC ....... G06F 3/061; G06F 3/0679; G11C 5/063; G11C 11/5642; G11C 16/0483;
(Continued)

(56) References Cited

U.S. PATENT DOCUMENTS

2008/0144368 A1* 6/2008 Kamei ................ G11C 11/5642
365/185.18
2018/0261296 A1* 9/2018 Choi ...................... G11C 16/08
(Continued)

FOREIGN PATENT DOCUMENTS

WO WO-2007149678 A2 * 12/2007 ......... G11C 11/5628

OTHER PUBLICATIONS

Combined Taiwanese Office Action and Search Report issued on May 2, 2024 in the corresponding Taiwanese Application No. 112125744 (with English Translation of Category of Cited Documents) citing reference 1 therein, 12 pages.

(Continued)

*Primary Examiner* — Fernando Hidalgo
(74) *Attorney, Agent, or Firm* — Oblon, McClelland, Maier & Neustadt, L.L.P.

(57) ABSTRACT

A memory system includes a memory controller configured to determine a first best read offset of a first best read reference voltage with respect to a first default read reference voltage, and determine an anchor read reference voltage having a same offset as the first best read offset with respect to a second default read reference voltage. The first and second default read reference voltages are set for reading a page from a set of MLCs in a semiconductor memory device. A first scan range can be determined based on the anchor read reference voltage. A second best read offset of a second best read reference voltage with respect to the second read reference voltage can be determined by searching in the first scan range. A reading process can be performed to read the page from the set of MLCs based on the first and second best read reference voltages.

20 Claims, 14 Drawing Sheets

(51) Int. Cl.
  *G11C 11/56* (2006.01)
  *G11C 16/04* (2006.01)
  *G11C 16/12* (2006.01)
  *G11C 16/26* (2006.01)
  *G11C 16/34* (2006.01)
(52) U.S. Cl.
  CPC ...... *G11C 11/5642* (2013.01); *G11C 16/0483* (2013.01); *G11C 16/12* (2013.01); *G11C 16/26* (2013.01); *G11C 16/34* (2013.01); *G11C 16/3418* (2013.01); *G11C 16/3427* (2013.01); *G11C 2211/5621* (2013.01)
(58) Field of Classification Search
  CPC ......... G11C 16/12; G11C 16/26; G11C 16/34; G11C 16/3418; G11C 16/3427; G11C 2211/5621; G11C 16/28
  USPC ...................................................... 365/185.02
  See application file for complete search history.

(56) References Cited

U.S. PATENT DOCUMENTS

| | | | |
|---|---|---|---|
| 2019/0362796 A1* | 11/2019 | Choi | G11C 16/14 |
| 2023/0205690 A1* | 6/2023 | Yeung | G11C 5/148 |
| | | | 711/154 |
| 2023/0259287 A1 | 8/2023 | Takada et al. | |

OTHER PUBLICATIONS

International Search Report issued on Jun. 23, 2023 in the corresponding International Application No. PCT/CN2023/071275 citing reference 24 therein, 3 pages.

Micron Technology, Inc. "An Introduction to NAND Flash and How to Design It in to Your Next Product", TN-29-19: NAND Flash 101, Dec. 31, 2019, 27 pages.

* cited by examiner

BEST READ REFERENCE VOLTAGE SEARCH OF 3D NAND MEMORY

INCORPORATION BY REFERENCE

The present application is a bypass continuation of International Application No. PCT/CN2022/138853, filed Dec. 14, 2022, the disclosure of which is incorporated by reference herein in its entirety.

TECHNICAL FIELD

The present application is related to three-dimensional (3D) NAND flash memory operation techniques.

BACKGROUND

Three-dimensional (3D) NAND flash memory employs advanced multi-level cell (MLC) techniques to provide high storage density. The read-retry mechanism is used to improve the reliability of 3D NAND flash memory. For example, multiple retry steps with adjusted read reference voltage values can be performed to read a target page multiple times before an encoded page can be correctly decoded. A large number of read-retry operations can significantly increase the read latency and degrade the performance of a memory system.

SUMMARY

Aspects of the disclosure provide a method of a memory system. The method can include determining a first best read offset of a first best read reference voltage with respect to a first default read reference voltage, and determining an anchor read reference voltage having a same offset as the first best read offset with respect to a second default read reference voltage. The first default read reference voltage and the second default read reference voltage are set for reading a page from a set of multi-level cells (MLCs) in a semiconductor memory device in the memory system. A first scan range can be determined based on the anchor read reference voltage. An upper limit of the first scan range is the anchor read reference voltage plus an upper limit offset, and a lower limit of the first scan range is the anchor read reference voltage plus a lower limit offset. The upper limit offset and the lower limit offset can be a positive voltage value or a negative voltage value. A second best read offset of a second best read reference voltage with respect to the second read reference voltage can be determined based on the first scan range.

In an embodiment, the determining the first best read offset includes determining a second scan range, the second scan range having an upper limit that is the first default read reference voltage plus an upper limit offset and a lower limit that is the first default read reference voltage plus a lower limit offset; scanning the second scan range based on a coarse step voltage by performing a series of first single read operations within the second scan range, each first single read operation corresponding to a first read reference voltage, each first single read operation generating a bit count of either 1 or 0; for each first single read operation, determining a first bit count difference between the bit counts of the respective first single read operation and the previous first single read operation, if available, and a second bit count difference between the bit counts of the respective first single read operation and the subsequent first single read operation, if available; and determining the first read reference voltage of the first single read operation, of which a sum of the respective first bit count difference and the respective second bit count difference has a minimum value among the series of first single read operations, to be a coarse best read reference voltage.

In an embodiment, the method can further include, when there are more than one first single read operations, of which sums of the respective first bit count differences and the respective second bit count differences have a same value, determining the first read reference voltage of the first single read operation, of which a minimum of the respective first bit count difference and the respective second bit count difference has a minimum value among the more than one first single read operations, to be the coarse best read reference voltage.

In an embodiment, the method can further include determining a third scan range, the third scan range having an upper limit that is the coarse best read reference voltage plus the coarse step voltage and a lower limit that is the coarse best read reference voltage minus the coarse step voltage; scanning the third scan range based on a fine step voltage by performing a series of second single read operations within the third scan range, each second single read operation corresponding to a second read reference voltage, each second single read operation generating a bit count of either 1 or 0; for each second single read operation, determining a first bit count difference between the bit counts of the respective second single read operation and the prior second single read operation, if available, and a second bit count difference between the bit counts of the respective second single read operation and the subsequent second single read operation, if available; and determining the second read reference voltage of the second single read operation, of which a sum of the respective first bit count difference and the respective second bit count difference has a minimum value among the series of the second single read operations, to be the first best read reference voltage, an offset of the first best read reference voltage with respect to the first default read reference voltage being the first best read offset.

In an embodiment, the determining the second best read offset of the second best read reference voltage with respect to the second default read reference voltage based on the first scan range includes scanning the first scan range by performing a series of third single read operations within the first scan range, each third single read operation corresponding to a third read reference voltage, each third single read operation generating a bit count of either 1 or 0; for each third single read operation, determining a first bit count difference between the bit counts of the respective third single read operation and the prior third single read operation, if available, and a second bit count difference between the bit counts of the respective third single read operation and the subsequent third single read operation, if available; and determining the third read reference voltage of the third single read operation, of which a sum of the respective first bit count difference and the respective second bit count difference has a minimum value among the series of third single read operations, to be the second best read reference voltage, an offset of the second best read reference voltage with respect to the second default read reference voltage being the second best read offset. In an example, the first, second, and third single read operations are partial page read operations.

In an embodiment, the method can further include collecting a first set of first best read offsets, each first best read offset being a voltage shift of a best read reference voltage from the first default read reference voltage, each first best read offset corresponding to a memory cell condition that causes a set of memory cells under such memory cell condition to have the respective first best read offset, the first set of the first best read offsets each having a positive value or a negative value; setting a maximum value of the first set of the first best read offsets to be the upper limit offset of the second scan range; and setting a minimum value of the first set of the first best read offsets to be the lower limit offset of the second scan range.

In an embodiment, the method can further include collecting a second set of second best read offsets, each second best read offset corresponding to one of the first set of the first best read voltages and the respective memory cell condition, each second best read offset being a voltage shift of a best read reference voltage from the second default read reference voltage, the second set of the second best read offsets each having a positive value or a negative value; determining a difference between each pair of the first best read offset and the respective second best read offset, the difference being equal to the respective second best read offset minus the respective first best read offset; setting a maximum value of the differences between each pair of the first best read offset and the respective second best read offset to be the upper limit offset of the first scan range; and setting a minimum value of the differences between each pair of the first best read offset and the respective second best read offset to be the lower limit offset of the first scan range.

In an embodiment, the method can further include determining an error correction code (ECC) decoding process is failed for reading the page before the determining the first best read offset of the first best read reference voltage with respect to the first default read reference voltage. In an embodiment, an ECC soft decoding process is performed to read the page from the set of MLCs based on the first best read reference voltage and the second best read reference voltage. In an embodiment, the first or second default read reference voltage corresponds to default read reference voltage of the MLCs.

Aspects of the disclosure provide a non-transitory computer-readable medium storing instructions. The instructions, when executed by a processor, cause the processor to perform the method.

Aspects of the disclosure provide a memory system. The memory system can include a semiconductor memory device and a memory controller operating the semiconductor memory device. The memory controller can include circuitry. The circuitry is configured to determine a first best read offset of a first best read reference voltage with respect to a first default read reference voltage, and determine an anchor read reference voltage having a same offset as the first best read offset with respect to a second default read reference voltage. The first default read reference voltage and the second default read reference voltage are set for reading a page from a set of multi-level cells (MLCs) in a semiconductor memory device in the memory system. A first scan range can be determined based on the anchor read reference voltage. An upper limit of the first scan range is the anchor read reference voltage plus an upper limit offset, and a lower limit of the first scan range is the anchor read reference voltage plus a lower limit offset. The upper limit offset and the lower limit offset can be a positive voltage value or a negative voltage value. A second best read offset of a second best read reference voltage with respect to the second read reference voltage can be determined based on the first scan range.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION OF EMBODIMENTS

Figure 1:
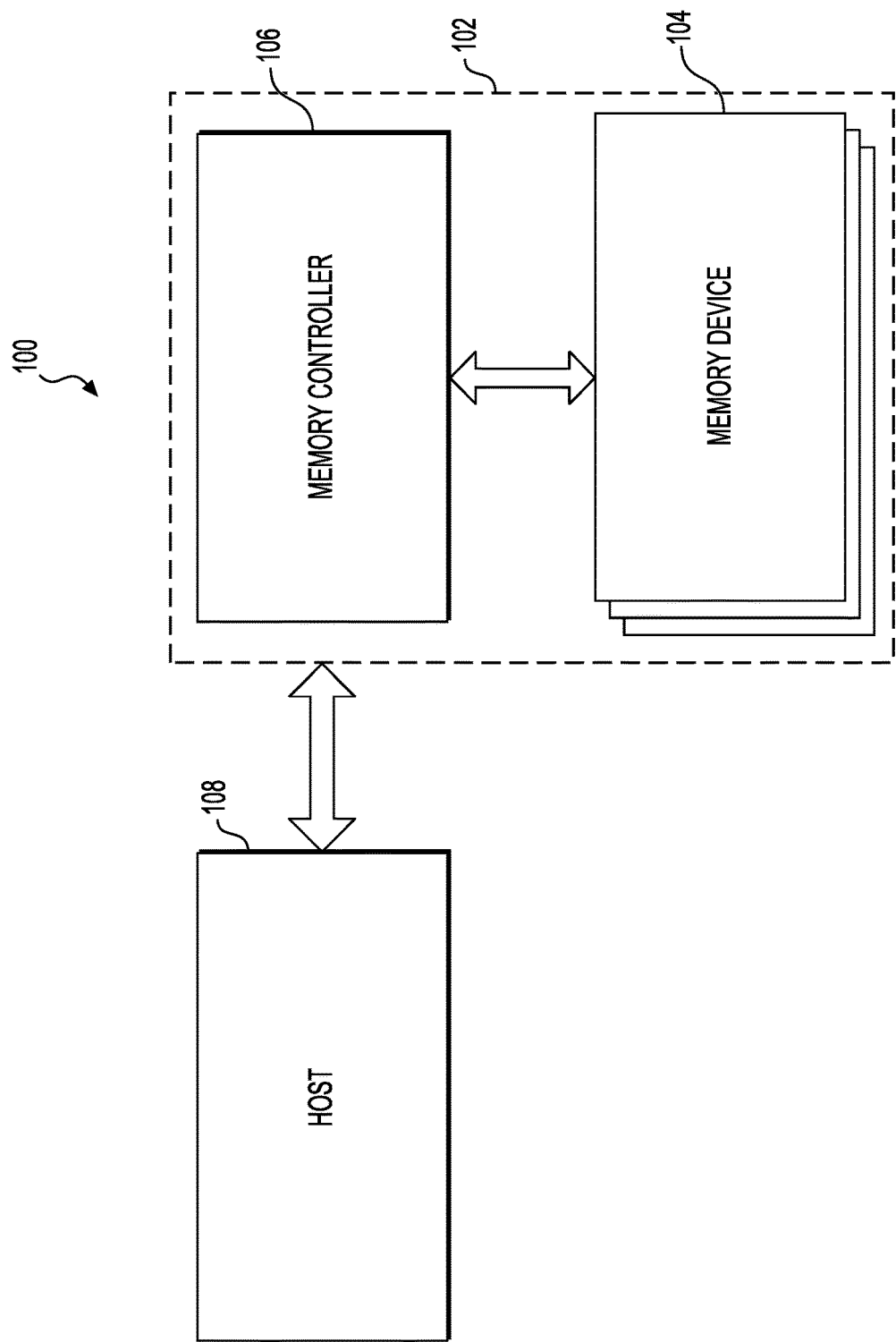
FIG. 1 illustrates a block diagram of a system 100 having a memory device according to some aspects of the present disclosure.

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosure can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure is not limited to three-dimensional (3D) NAND memory devices, although 3D NAND devices may be used in some examples to illustrate inventive concepts. For example, the techniques disclosed herein can be applied to planar NAND memory devices.

Aspects of the disclosure provide methods and techniques for searching for best read reference voltages (best read levels). The best read levels can subsequently be used for a read retry or a soft decoding process. In an embodiment, corresponding to a read level, a scan process can be performed over multiple scan points in a scan voltage range (scan range). A series of single read operations can be performed at each scan point over a word-line memory cell string storing one or more pages of data. Each single read operation can output a bit count. A best read level can be determined based on bit count differences between two consecutive single read operations. Thus, the search process does not reply on known data stored in memory cells.

In addition, scan range optimization methods are provided to accelerate best level search processes. For example, corresponding to different memory cell conditions, data of first best read offset with respect to a first default read reference voltage and second best read offsets with respect to a second default read reference voltage can be collected. A range of the voltage differences between voltage values of the first best read offsets and the respective second best read offsets can be determined. A best read level resulting from a first search process at a firs read level can be used as an anchor voltage for a second search process at a second read level. A search range for the second search process can be determined based on the range of the voltage differences around the anchor voltage.

FIG. 1 illustrates a block diagram of a system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104. Memory device 104 can be any memory device disclosed in the present disclosure.

Memory controller 106 is coupled to memory device(s) 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment like solid state drives (SSDs) or embedded multi-media-cards (eMMCs) used as data storage for mobile devices, such as smartphones, tablets, laptop computers, etc., and enterprise storage arrays.

Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Consistent with some aspects of the present disclosure, in some implementations, memory controller 106 is configured to fully or partially perform the best read reference voltage search methods, as described herein.

Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products.

Figure 2A:
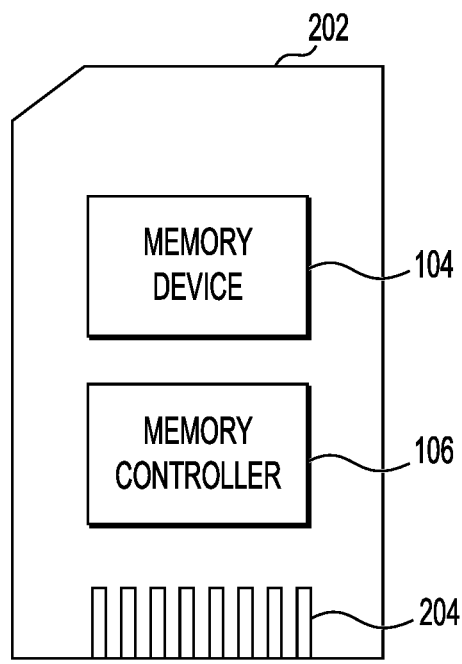
FIGS. 2A-2B show two examples of memory systems according to some aspects of the present disclosure.
Figure 2B:
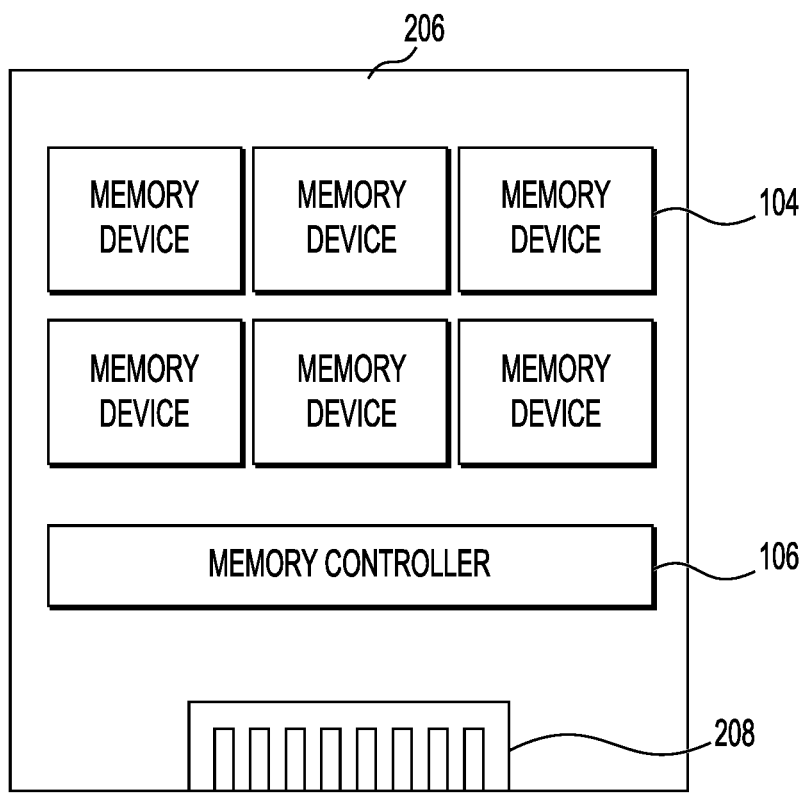

In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
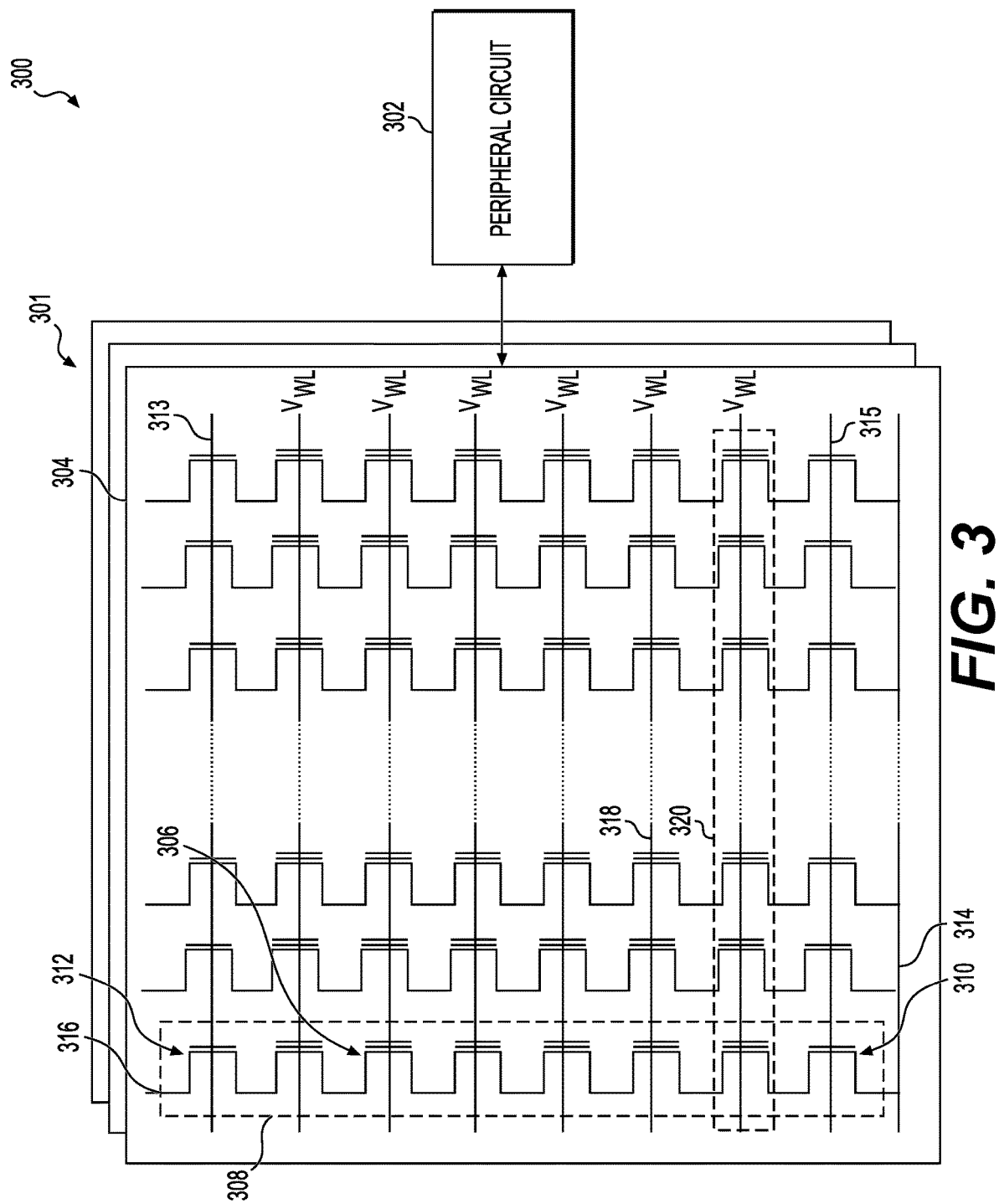
FIG. 3 illustrates a schematic circuit diagram of a memory device 300 including peripheral circuits according to some aspects of the present disclosure.

FIG. 3 illustrates a schematic circuit diagram of a memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell (also known as double-level cell (DLC)), three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3 each NAND memory string 308 can include a source select gate (SSG) 310 (or referred to as a source select transistor) at its source end and a drain select gate (DSG) 312 (or referred to as a drain select transistor) at its drain end. SSG 310 and DSG 312 can be configured to activate selected NAND memory strings 308 (columns of the array) during read and program operations. In some implementations, the sources of NAND memory strings 308 in a same block 304 are coupled through a same source line (SL) 314, e.g., a common SL. In other words, all NAND memory strings 308 in the same block 304 have an array common source (ACS), according to some implementations. DSG 312 of each NAND memory string 308 is coupled to a respective bit line 316 from which data can be read or written via an output bus (not shown), according to some implementations. In some implementations, each NAND memory string 308 is configured to be selected or deselected by applying a select voltage (e.g., above the threshold voltage of the transistor having DSG 312) or a deselect voltage (e.g., 0 V) to respective DSG 312 through one or more DSG lines 313 and/or by applying a select voltage (e.g., above the threshold voltage of the transistor having SSG 310) or a deselect voltage (e.g., 0 V) to respective SSG 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a selected block 304, source lines 314 coupled to selected block 304 as well as unselected blocks 304 in the same plane as selected block 304 can be biased with an erase voltage (Vers), such as a high positive voltage (e.g., 20 V or more). It is understood that in some examples, erase operation may be performed at a half-block level, a quarter-block level, or a level having any suitable number of blocks or any suitable fractions of a block.

Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can relate to the number of NAND memory strings 308 coupled by word line 318 in one block 304. For ease of description, memory cells 306 in one page 320 may be coupled to a same word line 318, and the terms "page" and "word line" may be used interchangeably in the present disclosure. It is understood that, however, in some examples, memory cells 306 in one page 320 may be coupled to more than one word lines 318. Each word line 318 can include a plurality of control gates (gate electrodes) at each memory cell 306 in respective page 320 and a gate line coupling the control gates. In some implementations, each word line 318 can be coupled to multiple pages (or partial pages) of memory cells based on the control of SSGs and DSGs.

Peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies.

Figure 4:
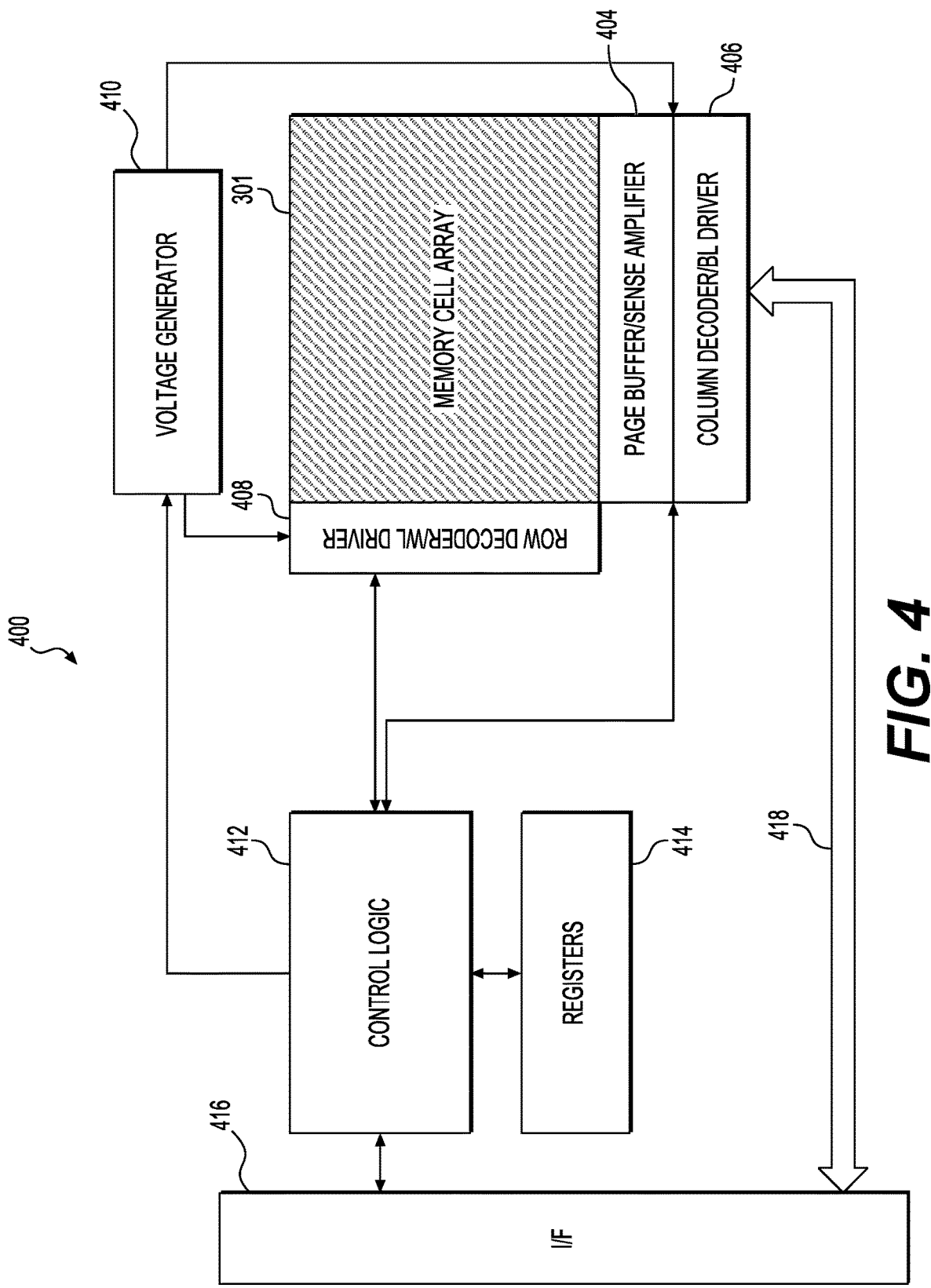
FIG. 4 illustrates examples of peripheral circuits according to some aspects of the present disclosure.

For example, FIG. 4 illustrates some peripheral circuits including a page buffer/sense amplifier 404, a column decoder/bit line driver 406, a row decoder/word line driver 408, a voltage generator 410, control logic 412, registers 414, an interface 416, and a data bus 418. It is understood that in some examples, additional peripheral circuits not shown in FIG. 4 may be included as well.

Page buffer/sense amplifier 404 can be configured to read and program (write) data from and to memory cell array 301 according to the control signals from control logic 412. In one example, page buffer/sense amplifier 404 may store one page of program data (write data) to be programmed into one page 320 of memory cell array 301. In another example, page buffer/sense amplifier 404 may perform program verify operations to ensure that the data has been properly programmed into memory cells 306 coupled to selected word lines 318. In still another example, page buffer/sense amplifier 404 may also sense the low power signals from bit line 316 that represents a data bit stored in memory cell 306 and amplify the small voltage swing to recognizable logic levels in a read operation. Column decoder/bit line driver 406 can be configured to be controlled by control logic 412 and select one or more NAND memory strings 308 by applying bit line voltages generated from voltage generator 410.

Row decoder/word line driver 408 can be configured to be controlled by control logic 412 and select/deselect blocks 304 of memory cell array 301 and select/deselect word lines 318 of block 304. Row decoder/word line driver 408 can be further configured to drive word lines 318 using word line voltages generated from voltage generator 410. In some implementations, row decoder/word line driver 408 can also select/deselect and drive SSG lines 315 and DSG lines 313 as well. As described below in detail, row decoder/word line driver 408 is configured to apply a read voltage to selected word line 318 in a read operation on memory cell 306 coupled to selected word line 318. The read voltage can be either the compensated read voltage with the open block-based read offset when the read voltage is applied to word line 318 in an open block or the default read voltage without the open block-based read offset when the read voltage is applied to word line 318 in a full block.

Voltage generator 410 can be configured to be controlled by control logic 412 and generate the word line voltages (e.g., read voltage, program voltage, pass voltage, local voltage, verification voltage, etc.), bit line voltages, and source line voltages to be supplied to memory cell array 301. As described below in detail, depending on whether the read operation is performed in an open block or a full block, control logic 412 can control voltage generator 410 to provide either a default read voltage or a compensated read voltage having an offset from the default read voltage to row decoder/word line driver 408.

Control logic 412 can be coupled to each peripheral circuit described above and configured to control operations of each peripheral circuit. Registers 414 can be coupled to control logic 412 and include status registers, command registers, and address registers for storing status information, command operation codes (OP codes), and command addresses for controlling the operations of each peripheral circuit. As described below in detail, the status registers of registers 414 can include one or more registers configured to store open block information indicative of the open block(s) of all blocks 304 in memory cell array 301, such as having an ADSV list. In some implementations, the open block information is also indicative of the last programmed page of each open block.

Figure 5:
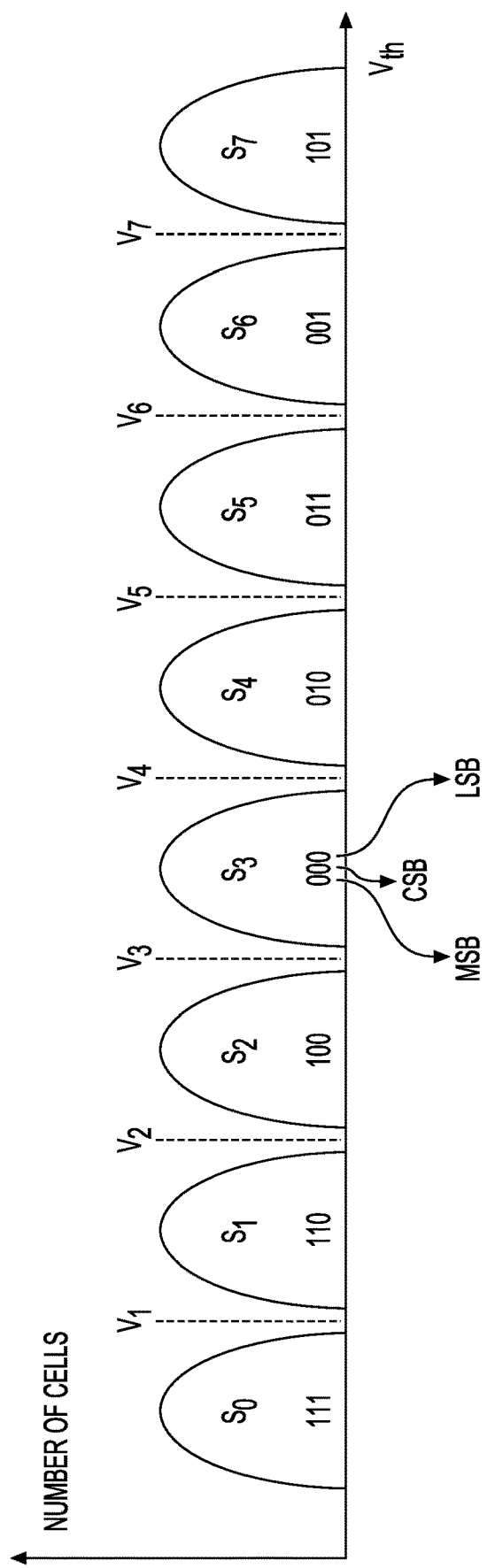
FIG. 5 shows a schematic diagram of threshold voltage distributions of memory cells according to embodiments of the disclosure.

FIG. 5 shows a schematic diagram of threshold voltage distributions of memory cells according to embodiments of the disclosure. The horizontal axis represents threshold voltages (denoted Vth) of the memory cells. The vertical axis represents numbers of the memory cells corresponding to different threshold voltages.

In FIG. 5, the memory cells can be memory cells in a 3D NAND memory device corresponding to a page, a code word, a word-line memory cell string, a block, a plane, a die, and the like. The memory cells are TLCs and can be programmed (or erased) to be in one of 8 states (memory states), denoted from S0 to S7. Memory cells programmed (or erased) to be in a specific state can have threshold voltages distributed within a voltage range. Accordingly, in FIG. 5, each state (from S0 to S7) is shown to have a threshold voltage distribution. In some examples, these distributions can each be modeled using Poisson distribution.

A TLC memory cell, depending on which state the memory cell is in, can represent three bits. In other words, three bits can be encoded in one of the 8 states. The mapping between the states and the respective three bits can vary in different embodiments. In FIG. 5, the 8 states from S0 to S7 are mapped to 111, 110, 100, 000, 010, 011, 001, and 101, respectively. Least significant bits (LSBs) in the 8 states can belong to a lower page. Center significant bits (CSBs) in the 8 states can belong to a middle page. Most significant bits (MSBs) in the 8 states can belong to an upper page.

In FIG. 5, seven default read reference voltages from V1 to V7 are positioned between the respective memory cell threshold voltage distributions. Ideally, each memory cell threshold voltage distribution can be contained within two neighboring default read reference voltages. In other words, it is desired that a programmed or erased memory cell can keep an intended state thus maintaining the three bits represented. However, the memory cell threshold distribution may shift or expand from one distribution to another distribution, due to, for example, program/erase (P/E) cycle, retention age, write or read disturbance, temperature variance, and the like. Such a change of the memory cell threshold distribution causes read errors.

Corresponding to a certain default read reference voltage, if a memory cell has a threshold voltage below the default read reference voltage, the memory cell is said to be in a lower state. If a memory cell has a threshold voltage above the default read reference voltage, the memory cell is said to be in an upper state. Also, in FIG. 5, a state to the right side of the default read reference voltage is called an upper state with respect to the default read reference voltage. A state to the left side of the default read reference voltage is called a lower state with respect to the default read reference voltage.

Corresponding to different MLC techniques, different sets of default read reference voltages can be used. For example, SLCs can use one default read reference voltage to distinguish two states. DLCs can use three default read reference voltages to distinguish four states. QLCs can use 15 default read reference voltages to distinguish 16 states.

Figure 6:
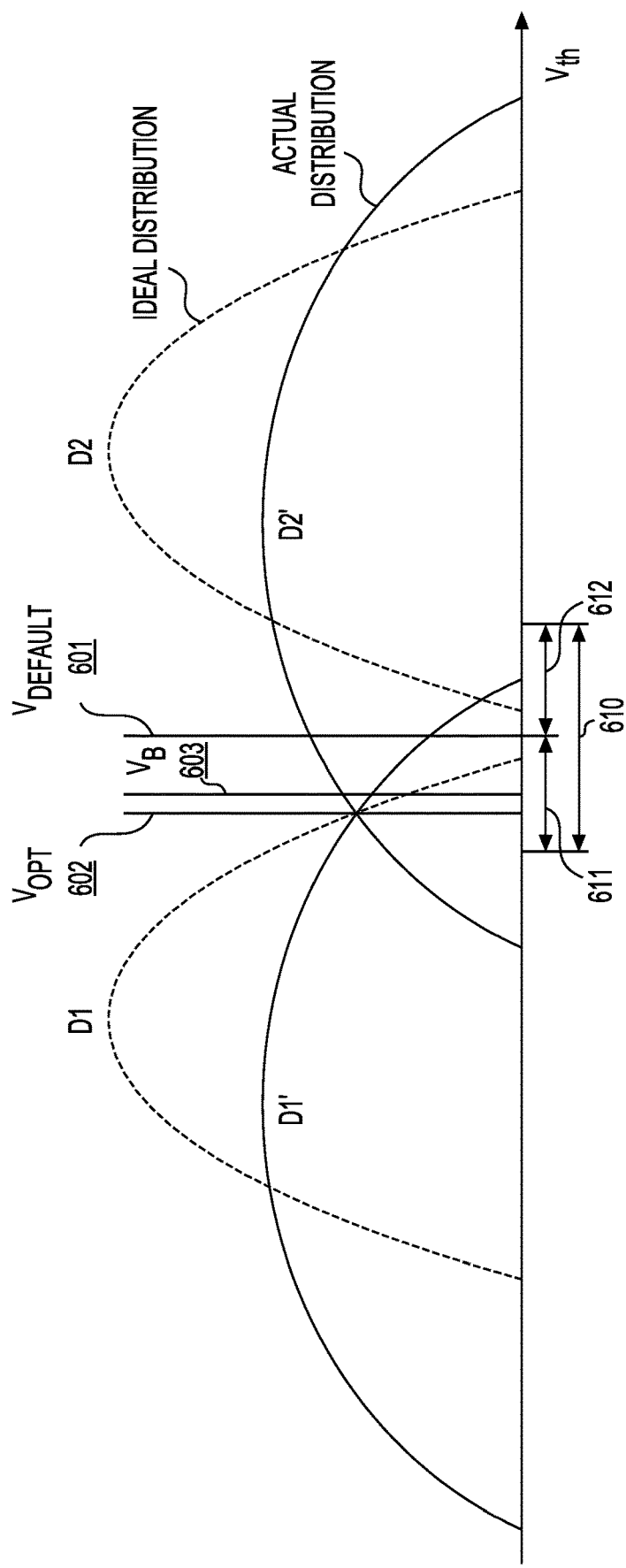
FIG. 6 shows a scenario where memory cell threshold voltage distributions have shifted.

FIG. 6 shows a scenario where memory cell threshold voltage distributions have shifted. Distributions D1 and D2 (dashed lines) represent ideal memory cell threshold voltage distributions corresponding to two neighboring states (such as S1 and S2 in FIG. 5). A default read reference voltage 601, denoted $V_{default}$, is positioned between the Distribution D1 and the Distribution D2. Corresponding to the ideal threshold voltage distributions, the memory cells are in the states that exactly represent or map with encoded bits of data programmed into the memory cells. Typically, states of memory cells at the time of the memory cells being programmed can be in an ideal distribution. In other words, memory cells at the time of being programmed can have an ideal threshold voltage (or state) distribution.

Corresponding to Distributions D1 and D2, when a single-read operation is performed using the default read reference voltage 601, memory cells belonging to Distribution D2 are detected to be, for example, in a status of 0 (indicating having a threshold voltage larger than $V_{default}$), resulting in bits of 0. Memory cells belonging to Distribution D1 are detected to be, for example, in a status of 1 (indicating having a threshold voltage lower than $V_{default}$), resulting in bits of 1. Those detected bits correspond to ideal threshold voltage distributions or the states of the memory cells at the time of being programmed. Thus, those bits are referred to as original bits or ideal bits with respect to the corresponding default read reference voltage 601. It is noted that, when data programmed into a set of memory cells are known, ideal states of the set of memory cells (e.g., states S0-S7 in FIG. 5) can be determined based on the data without any read operations. Thus, original bits can be derived or calculated if the associated data is known. Accordingly, original bits can also be used to refer to derived bits or calculated bits in the context of determining error bits based on known data.

In comparison with a page read operation where multiple read operations occur at multiple different read reference voltages, a read operation at a single-read reference voltage (such as a default or non-default read reference voltage) is referred to as a single-read operation.

Distribution D1' and D2' represent actual memory cell threshold voltage distributions as a result of the ideal Distributions D1 and D2 having shifted. Under the actual distributions, when a single-read operation is performed using the default read reference voltage 601, memory cells belonging to Distribution D2' but each having a threshold value smaller than $V_{default}$ would be detected to be, for example, in a status of 1 (indicating having a threshold voltage smaller than $V_{default}$), resulting in bits of 1. Thus, the original bits 0 represented by these memory cells have flipped to be 1. These flipping bits are referred to as upper-state flipping bits as the respective memory cells have changed the status from an upper state to a lower state.

Memory cells belonging to Distribution D1' but each having a threshold value larger than $V_{default}$ would be detected to be, for example, in a status of 0 (indicating having a threshold voltage larger than $V_{default}$), resulting in bits 0. Thus, the original bits 1 represented by these memory cells have flipped to be 0. These flipping bits are referred to as lower-state flipping bits as the respective memory cells have changed the status from a lower state to an upper state. Besides the memory cells associated with the lower-state or upper-state flipping bits, other memory cells belonging to Distributions D1' and D2' can still be correctly detected to be in status 1 and 0, respectively.

During a page read operation (including multiple single-read operations), flipping bit errors from the multiple single-read operations can lead to bit errors in code words of a page. When a raw bit error rate (RBER) of a code word reaches a level beyond ECC correction capability, related data (for example, corresponding to a page) cannot be recovered, leading to an ECC decoding failure. To achieve a successful ECC correction, it is desirable to reduce the number of flipping bits in a single-read operation.

The present disclosure provides techniques and methods for searching for a best read reference voltage to minimize or reduce the number of flipping bits. FIG. 6 shows an optimal read reference voltage 602, denoted $V_{opt}$. The optimal read reference voltage 602 can be a read reference voltage where the amount of flipping bits (including flipping from 1 to 0 or from 0 to 1) is minimum compared with other read reference voltages within a search range 610. A best read reference voltage 603 can be an output of a search process and is close to the optimal read reference voltage 602. The mismatch between the best read reference voltage 603 and the optimal read reference voltage 602 can be limited to be within a precision as set in the respective search process.

As shown, the search range 610 can have an upper limit offset 612 and a lower limit offset 611 defined with respect with to the default read reference voltage 601. Accordingly, an upper limit of the search range 610 can be the default read reference voltage 601 plus the upper limit offset 611. A lower limit of the search range 610 can be the default read reference voltage 601 plus the lower limit offset 611 (having a negative value).

Figure 7:
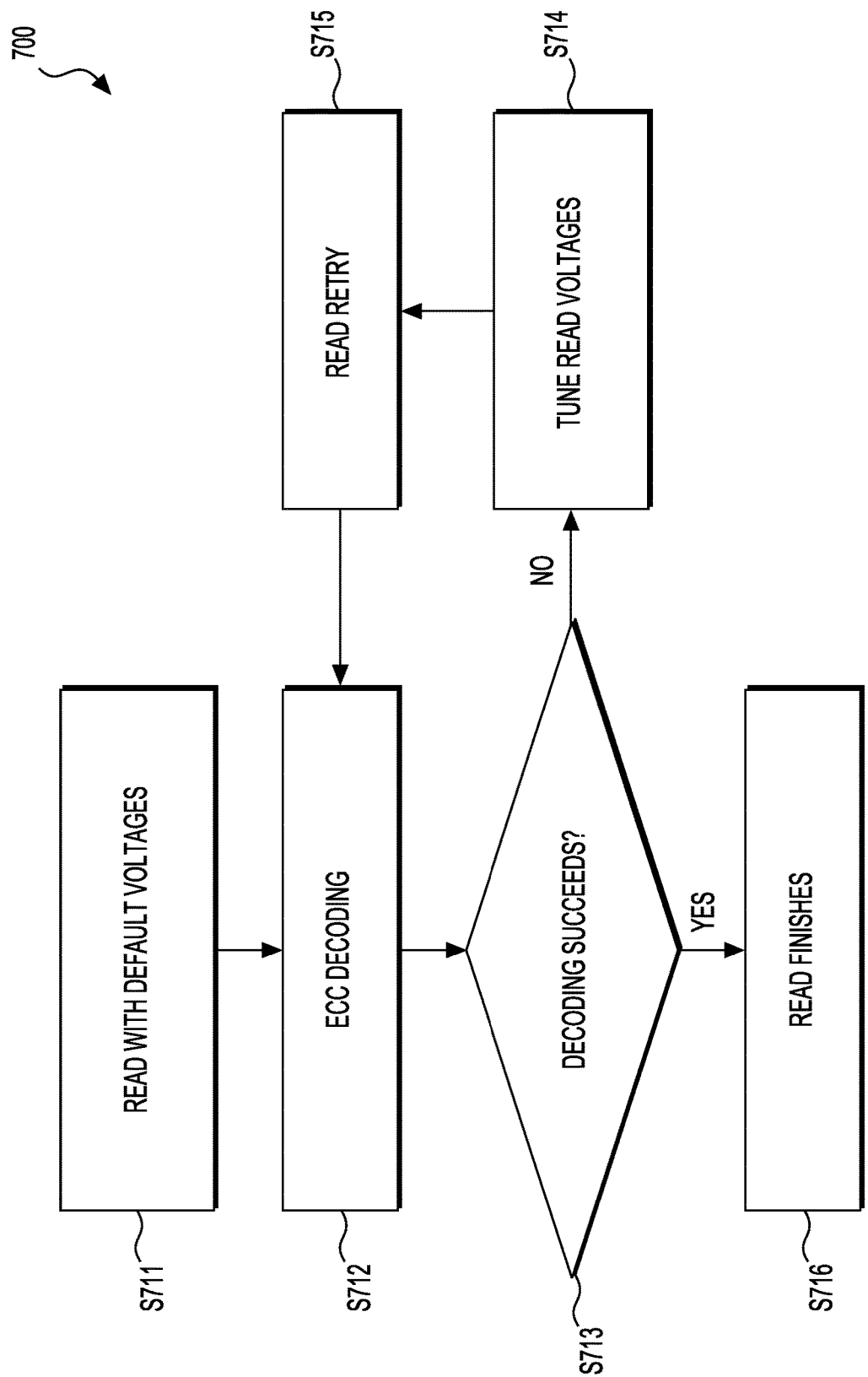
FIG. 7 shows a read process 700 according to embodiments of the disclosure.

FIG. 7 shows a read process 700 according to embodiments of the disclosure. The process 700 can be performed by the memory controller 106 to read data (such as a page or a supper page) from the 3D NAND memory device 104. The process 700 starts from S711.

At S711, a read operation can be performed to retrieve, for example, a page from the memory device 104. The page can be one of a lower page, a middle page, or an upper page stored in a set of TLCs. Accordingly, multiple single-read operations each based on a default read reference voltage can be performed on memory cells storing the page. For example, corresponding to the mapping between the triple bits and the eight states (S0-S7) in FIG. 5, three single-read operations at the default read reference voltages V2, V4, and V6 can be performed for reading a middle page. The bits resulting from each single-read operation can be processed to generate raw bits of code words belonging to the page.

At S712, an ECC decoding can be performed based on the raw bits of the code words. Various types of ECCs (such as low-density parity code (LDPC)) can be used in various embodiments. At S713, whether the ECC decoding succeeds is determined. When an RBER of any code word exceeds the ECC correction capability, the ECC decoding of the page will fail. When the ECC decoding fails, the process 700 proceeds to S714. Otherwise, the process 700 proceeds to S716 and terminates at S716.

At S714, tuning of read reference voltages is performed to determine a new read reference voltage. At S715, a read retry is performed based on the new read reference voltage. The operation at S715 can be similar to that at S711 but with an updated read reference voltage. Based on code word raw bits generated from S715, a second round of ECC decoding can be conducted at S712. The read retry can be repeated until the process 700 reaches S716 or available read reference voltages for read retry are exhausted.

When a read error occurs (at S713), there can be various ways for read error handling in various embodiments. In some examples, a read-retry table is used for a read-retry process. One or more lists of read-retry read reference voltages can be provided in the read-retry table, for example, by a producer of the respective 3D NAND memory device or memory system (such as an SSD). Typically, a read retry table is constructed based on consideration of a limited number of factors, such as retention age, read disturbance, cross temperature, first read issue, and the like. Thus, the read retry table may not be generic for all scenarios.

In some embodiments, the best read reference voltage search methods disclosed herein can be employed in place of or in addition to the usage of the read-retry table to determine a next read retry reference voltage.

In some embodiments, after an ECC decoding failure, the best read reference voltage search methods are triggered to find a best read reference voltage. The best read reference voltage can then be used as a base voltage of a soft LDPC decode process. In an example of the soft LDPC decode process, multiple read-retry read reference voltages can be set around the best read reference voltages. Accordingly, multiple read retry operations can be performed (in a step-by-step) manner to obtain Log-likelihood ratios (LLRs). The LLRs can be fed into an ECC engine (that can be separate from or part of the memory controller 106) to soft decode a code word.

Figures 8, 9:
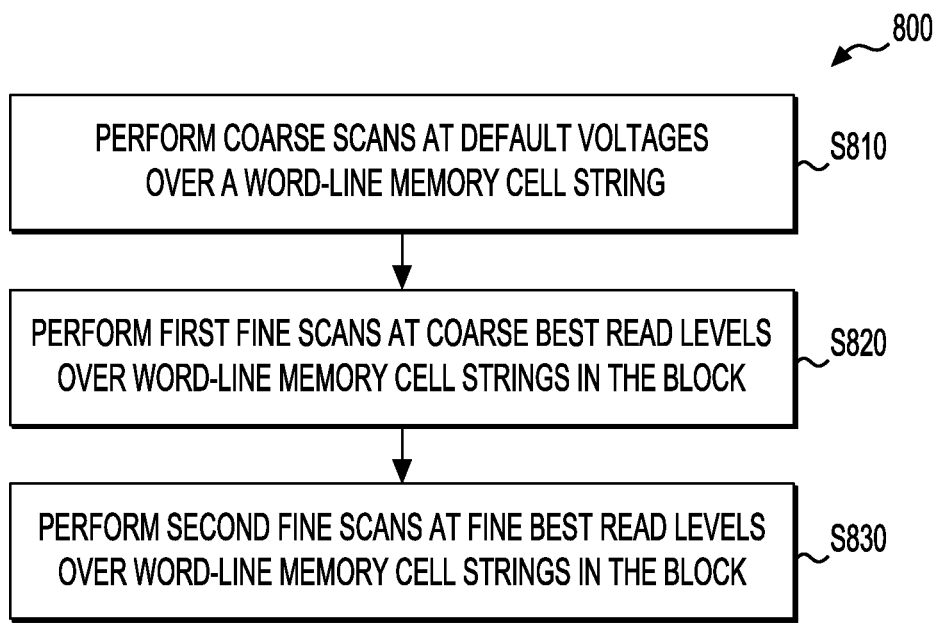
FIG. 8 shows a failed bit count (FBC)-based best read level search process 800 according to embodiments of the disclosure.
FIG. 9 shows a bit count difference (BCD) table 900 for determining a best read level from a series of read levels (scan points) during a scan process.

FIG. 8 shows a failed bit count (FBC)-based best read level search process 800 according to embodiments of the disclosure. The term best read level here refers to a best read reference voltage level. The process 800 can be carried out in an experimental environment where known data is programmed into, for example, a block of memory cells in a memory device.

The process 800 can include multiple coarse or fine scan processes. Each scan process can cover a search range of read reference voltages with a step voltage. At each scan point (corresponding to a specific read reference voltage level, or read level), read bits resulting from a single read operation can be compared with original bits to determine a FBC (the amount of flipping bits from 0 to 1 or from 1 to 0). The original bits can be derived based on the known data. A read level with a minimum FBC can be determined to be a best read level of the respective scan process. The search range can define with respect to a respective default read reference voltage (or referred to as a default voltage). The best read level can be expressed as a best read offset with respect to the default voltage.

The process 800 can include one step of coarse scan (S810) and two steps of fine scan (S820 and S830). TLCs are used as an example for an explanation of the process 800.

At S810, coarse scans are performed at default voltages over a word-line cell string. The default voltages, for example, can be V1-V7 which are all default voltages configured for TLCs. The word-line cell string can include memory cells that are controlled by a word line. The word-line cell string can store 3 pages of known data. Thus, initial states or original bits of the word-line cell string can be calculated based on the known data. The block under testing can include multiple layers of word lines A scan range and a step voltage can be provided for each coarse scan. For example, a lower limit offset of −300 mV and an upper limit offset of 300 mV can be provided with respect to the respective default voltage. Thus, the scan range can be {−300 mV, +300 mV} with the respective default voltage at the central point. For example, a coarse step voltage of 100 mV can be provided. Accordingly, seven scan points are provided: −300 mV, −200 mV, −100 mV, 0, 100 mV, 200 mV, and 300 mV.

For each coarse scan, a read level at a scan point having a minimum FBC can be determined to be a best read level. In some examples, for each scan point, the read bits from the word-line memory cell string can include bits of multiple code words. A FBC per code word can be determined. A maximum per-code-word FBC can be determined for each scan point or read level. Accordingly, a read level having a minimum maximum per-code-word FBC is determined as the best read level (referred to as coarse best read level) of the respective coarse scan. A best read offset (referred to as a coarse best read offset) can thus be determined for the respective coarse scan.

In case that multiple read levels of one coarse scan having the same maximum per-code-word FBC, a total FBC of all code words of each read level is considered. The read level having a minimum total FBC is determined to be the best read level. In case that multiple read levels of one coarse scan having the same minimum total FBC, the read level having a smaller offset is determined to be the best read level.

At S820, first fine scans are performed at the coarse best read levels over word-line memory cell strings in the block. For example, for each of the word-line memory cell string, seven first fine scans can be performed at 7 coarse best read levels. Each first fine scan can be provided with a scan range {−200 ms, 200 ms} with the respective best coarse read level at the middle. Assuming a best coarse read level offset from S810 is −100 ms, the scan rage would be {−300 ms, 100 ms} when a lower limit offset and an upper limit offset with respect to the respective default voltage are used to define a scan range. Each first fine scan can be provided with a fine step voltage of 20 ms, for example, which is smaller than the coarse step voltage of 100 mV. In a similar way as in S810, based on the FBCs, a fine best read level and a corresponding fine best read offset can be found for each first fine scan.

At S830, second fine scans are performed at the fine best read levels over word-line memory cell strings in the block. For example, for each of the word-line memory cell string, seven second fine scans can be performed at 7 fine best read levels. Each second fine scan can be provided with a scan range {−10 ms, 10 ms} with the best fine read level at the middle. Assuming a best fine read level offset from S820 is −120 ms, the scan rage would be {−130 ms, −110 ms} when a lower limit offset and an upper limit offset with respect to the respective default voltage are used to define a scan range. Each second fine scan can be provided with a fine step voltage of 10 ms (or smaller), for example, which is smaller than the fine step voltage of 20 mV. In a similar way as in S810 or S820, based on the FBCs, a final fine best read level and a corresponding final fine best read offset can be found for each second fine scan. At the end, for the block of memory cells, at each word-line memory cell string, a best read level can be obtained corresponding to each of the 7 default voltages. In various examples, the results can be used as the basis for various evaluations or experiments. For example, the results can be used to evaluate the performance of LDPC algorithms.

The FBC-based method described herein can typically be used for testing or experimental environments. The FBC-based method relies on known data programmed into the memory cells. For a real memory system, data stored in a memory device may not be known. The FBC-based method may scan every word-line memory cell string. For a real memory system, a best level search is performed at one word-line memory cell string in response to a failed page read operation over the word-line memory cell string. In the FBC-based method, scans over a word-line memory cell string consume too much time that may not be suitable for a real memory system.

In some embodiments, a bit count difference (BCD)-based best read level search method is used. In the BCD-based method, bit count differences between adjacent read levels (scan points) are calculated and used for determining a best read level. Accordingly, the BCD-based method does not rely on known data programmed in a memory device that may be unavailable in a real memory system.

In addition, the BCD-based method is used for finding best read levels for reading a page. Accordingly, scan operations are performed at a limited number of default voltages instead of every default voltage of a word-line memory cell string. For example, for reading a middle page, scan operations can be performed around three default voltages (e.g., V2, V4, and V6) to find three best read levels. Also, the scan operations are not performed on every word-line memory cell string in a whole block.

In some examples, in the BCD-based method, for each read level (scan point), a partial-page read is used instead of a full-page read during a single read operation. For example, a page stored in a word-line memory cell string may be 16 k-bites long. The page may include 4 code words each of 4 k-bites long. Thus, the BCD-based method can read from memory cells corresponding to a code word instead of a page. Bits resulting from the single read operation can be reduced. Accordingly, the delay of data transmission from a memory device to a memory controller can be reduced.

In some examples, scan ranges used in the BCD-based method are optimized based on read level shifts observed in some worst cases. Scan time can accordingly be reduced. In some examples, the BCD-based method can use one coarse scan and one fine scan. The scan process is simplified compared with one coarse scan and two fine scans in the search process 800. In some examples, hardware support is available for calculating bit counts for the BCDs. Compared with the FBC calculation performed using software, the time for computing the bit counts can be reduced.

FIG. 9 shows a BCD table 900 for determining a best read level from a series of read levels (scan points) during a scan process. The scan process can be part of a BCD-based best read level search process. A first column of the BCD table 900 includes the series of scan points covered in the scan process. The scan points are represented by a scan point offset (or a read level offset). A step voltage of 10 mV is used. At each scan point, a single read operation can be performed. Bits can be read from a set of memory cells belonging to a word-line memory cell string. For example, the memory cells with threshold voltages lower than the read level of the scan point are read as 1. The memory cells with threshold voltages higher than the read level of the scan point are read as 0.

Considering a current scan point, two BCDs can be calculated. A first BCD, denoted BCD-L, can be a BCD between the current scan point and a left scan point adjacent the current scan point. A second BCD, denoted BCD-R, can be a BCD between the current scan point and a left scan point adjacent the current scan point. The positions of left or right can be with respect to a search range along an axis of threshold voltage. Typically, a larger read level is at the right side of a smaller read level. For a read level close to the left border or a right border of a search range, a left or right scan point is unavailable. The respective BCD-L or BCD-R are not calculated and are unavailable. Typically, the read level close to a border of a search range can be excluded from candidate scan points for selecting a best read level.

With the above described BCD-L and BCD-R corresponding to each scan point, a best read level can be selected from the series of scan point. First, a read level at a scan point having a smallest sum of BCD-L and BCD-R (denoted Sum(BCD-L, BCD-R)) can be determined to be the best read level. If multiple scan points have a same sum of BCD-L and BCD-R, a read level at a scan point having a smallest minimum of BCD-L or BCD-R (denoted Min (BCD-L, BCD-R)) is determined to be the best read level among these multiple scan points. If still there are multiple scan points having a same minimum of BCD-L or BCD-R, a scan point closest to a middle point of the scan range can be determined as the best scan point with a best read level. Corresponding the best read level, the corresponding scan point offset can be determined to be the best read offset with respect to the respective default voltage.

Figure 10A:
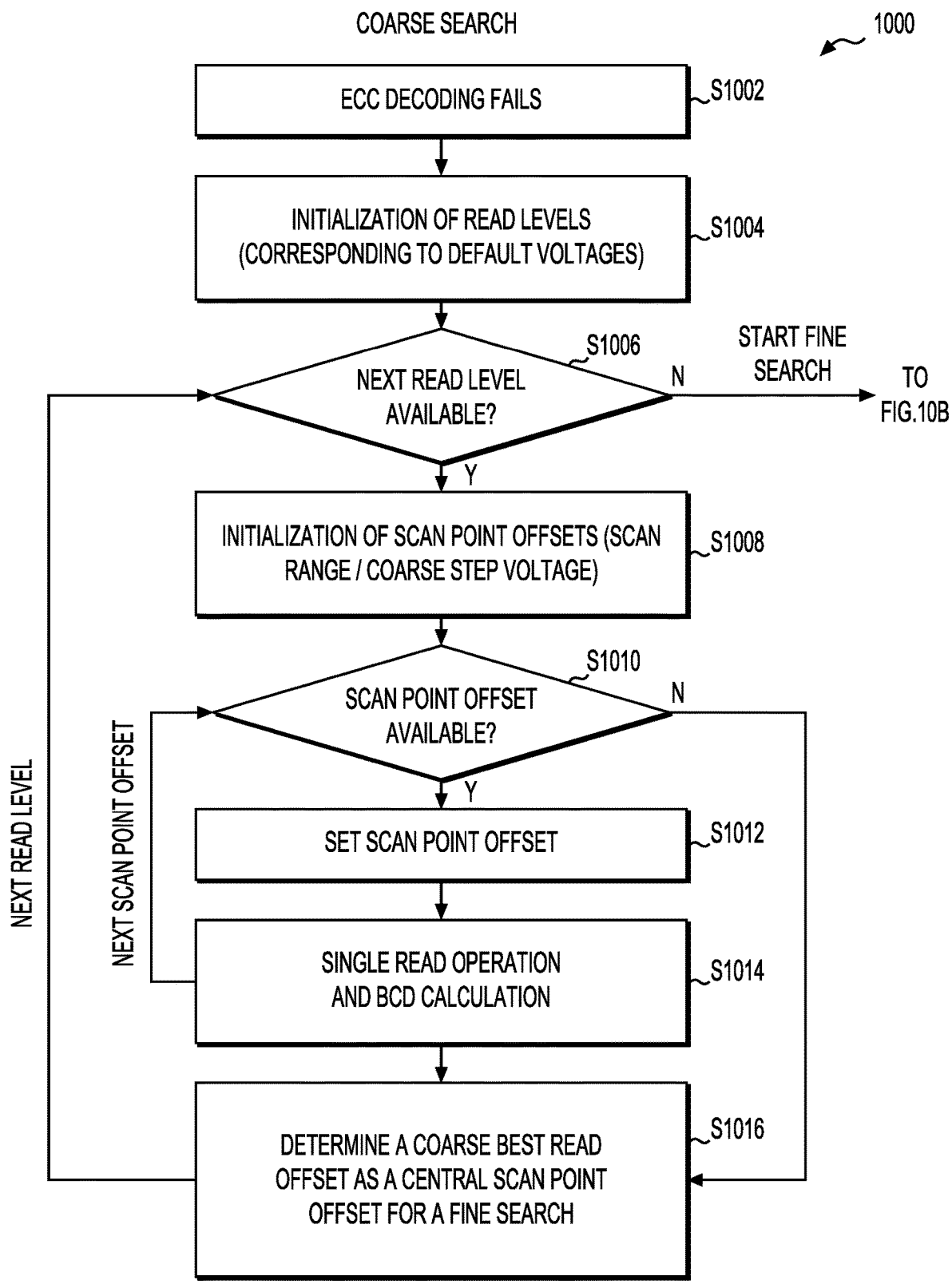
FIGS. 10A-10B show a BCD-based best read level search process 1000 according to embodiments of the disclosure.
Figure 10B:
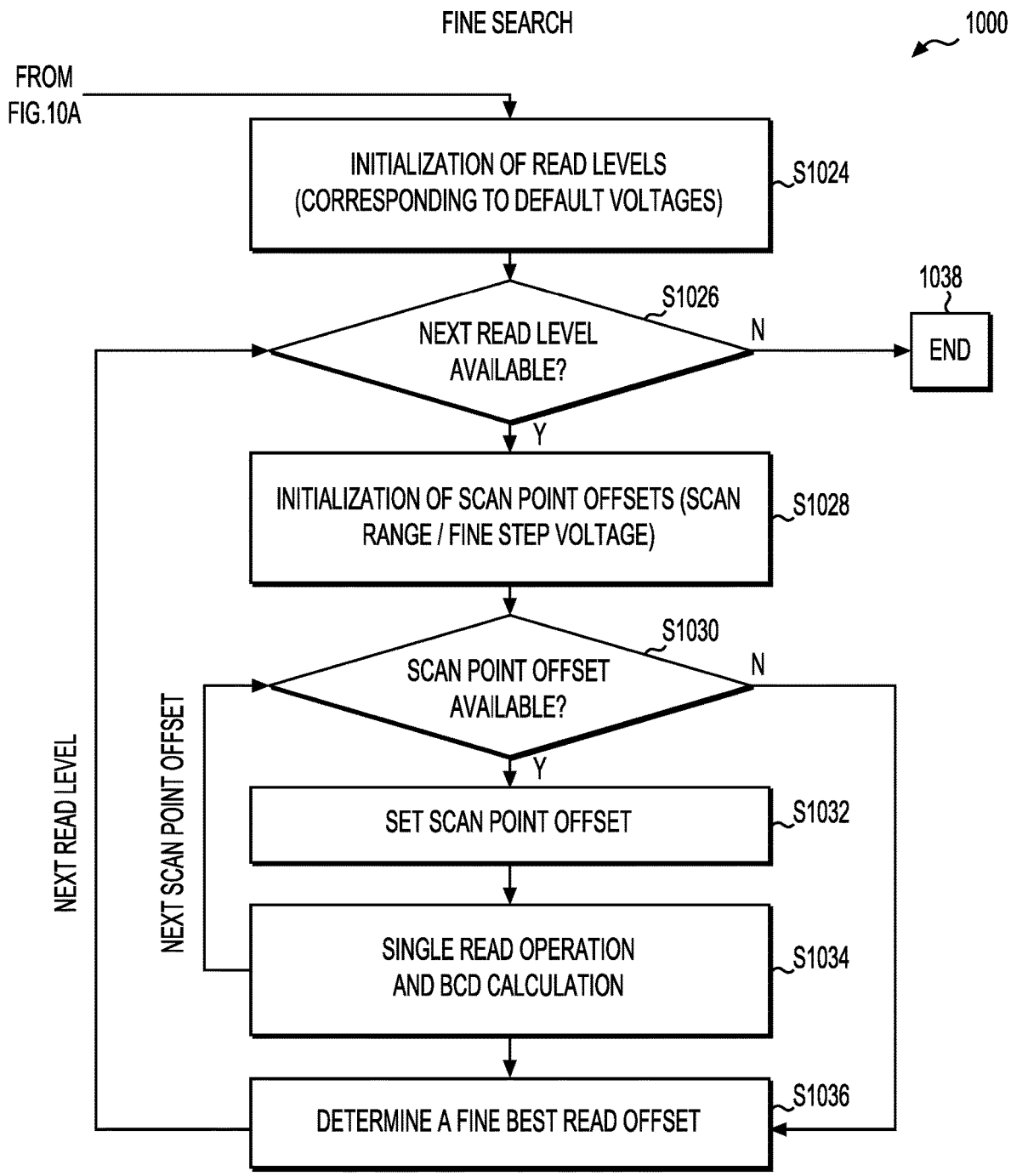

FIGS. 10A-10B show a BCD-based best read level search process 1000 according to embodiments of the disclosure. The BCD-based search process 1000 can be performed to find best read reference voltages for a page read operation. The process 1000 can include two portions: a coarse search portion from S1002 to S1016 and a fine search portion from S1024 to S1036.

At S1002, an ECC decoding fails for a page read operation. For example, raw code word bits of a target page can be obtained based on data read out of a memory device by one or more single read operations. A LDPC hard decoding based on the raw code word bits can fail due to a high RBER. The BCD-based search process 1000 can subsequently be triggered to find best read levels for a read retry or a soft LDPC decoding of the target page.

At S1004, read levels corresponding to default voltages can be initialized. Depending on which MLC technique the target page uses, which type the target page is of (e.g., lower or upper page), and how bits are encoded by memory cell states, the number of to-be-covered read levels can be determined. For example, for SLCs, one single read operation at one read level can be performed. For DLCs, one read level is covered for reading a lower page, and two read levels are covered for reading an upper page. For TLCs, two, three, and two read levels can be covered for reading a lower page, a middle page, and an upper page, respectively. The coarse search and fine search will cover the read levels determined at S1004.

At S1006, whether a next read level is available is determined. If all read levels determined at S1004 have been went through and a next read level is not available, the process 1000 proceeds to S1024 and enters the fine search portion. Otherwise, the process 1000 proceeds to S1008 with a selection of a read level among the read levels determined at S1004. The read levels can be selected in any order.

At S1008, scan point offsets can be initialized corresponding to the selected read level. For example, the number and positions (voltage values) of respective scan points can be determined based on a scan range (or a scan voltage range) and a step voltage. The scan point can be indicated in form of a scan point offset with respect to a respective default voltage corresponding to the selected read level. For example, an upper limit offset and a lower limit offset with respect to the default voltage can be provided to indicate the scan range.

At S1010, whether a next scan point offset is available is determined. If all scan point offsets determined at S1008 have been gone through and a next scan point offset is not available, the process 1000 proceeds to S1016. Otherwise, the process 1000 proceeds to S1012. At S1012, a scan point offset is selected among the scan point offsets determined at S1008. The scan point offsets can be selected in any order.

At S1014, a single read operation can be performed at the scan point of the selected scan point offset over the memory cells storing the target page. Bits resulting from the single read operation can be stored in a memory. If read bits of a neighboring scan point are available in the memory, the BCD-L or BCD-R between the current scan point and the neighboring scan point can be calculated and stored in a BCD table such as the table shown in FIG. 9. The process 1000 can return to S1010 to process a next scan point offset, if available.

At S1016, at the current stage, BCD-L and BCD-R for respective scan point offsets are filled in the BCD table corresponding to the current read level selected at S1006. Based on the BCD table, a coarse best read offset can be determined for the current read level. The coarse best read offset can be used as a central scan point offset for a fine search corresponding to the current read level. The process 1000 can proceed to S1006 to process a next read level, if available.

At S1024, the fine search portion of the process 1000 starts based on the coarse best read offsets of each read level. Specifically, at S1024, the read levels corresponding to the default voltages are initialized in a way similar to S1004. The same set of read levels can be determined. At S1026, whether a next read level is available can be determined. When all the read levels have been covered, the process 1000 can proceed to S1038 and terminate at S1038. Otherwise, the process 1000 proceeds to S1028 with a selected read level.

At S1028, scan point offsets for a fine search corresponding to the selected read level can be initialized. For example, the number and positions of the scan point offsets for the fine search can be determined based on a fine scan range and a fine step voltage. For example, the fine scan range can use the respective coarse best read level as a central point. An upper limit and a lower limit can be provided with respect to the central location.

At S1030, whether a next scan point offset is available can be determined. If all the scan point offsets have been covered, the process 1000 proceeds to S1036. Otherwise, the process 1000 proceeds to S1032. At S1032, a next scan point offset is selected. At S1034, a single read operation is performed at the selected scan point offset to read bits from the memory cells storing the target page. BCD-L or BCD-R of the current scan point offset or a neighboring scan point offset can be calculated to fill a BCD table. The process 1000 can return to S1030 to process a next available scan point offset.

At S1036, the BCD table corresponding to the current read level is filled. A fine best read offset can be determined for the current read level. The process 1000 can proceed to S1026 to process a next available read level. When the process 1000 terminates at S1038, a best read level corresponding to the fine best read offset is available for the respective read level. In some examples, the best read levels obtained can be subsequently used in a LDPC soft decode process.

Figure 11A:
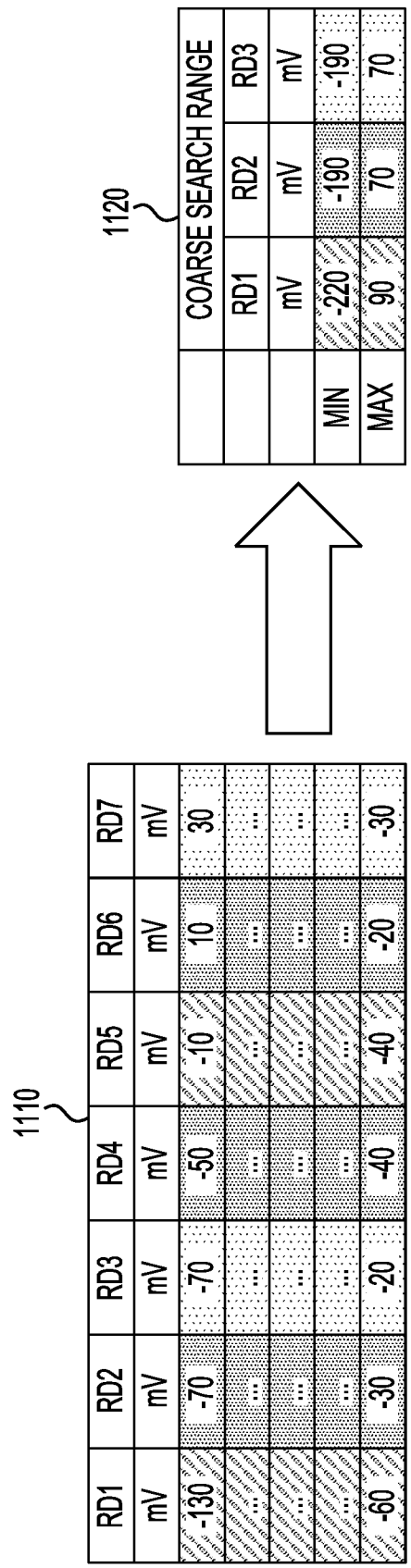
FIG. 11A shows two tables 1110 and 1120 for illustrating how to optimize the scan range used for a coarse search in the BCD-based search process 1000 according to embodiments of the disclosure.

FIG. 11A shows two tables 1110 and 1120 for illustrating how to optimize the scan range used for a coarse search in the BCD-based search process 1000 according to embodiments of the disclosure. In the FIG. 11A example, an optimized scan range for a coarse search (referred to as an optimized coarse scan range) at a specific read level corresponding to a respective default voltage can be determined based on a set of data provided in the table 1110. The table 1110 includes seven columns. Each column corresponds to one of seven read levels (or seven default voltages) for TLCs. The seven read levels are denoted from RD1 to RD7. The table 1110 includes multiple rows.

Each row includes a set of best read offsets each corresponding to one of the seven read levels from RD1 to RD7. Each best read offset has an offset value (in unit of mV) with respect to the respective default voltage (such as V1 to V7 in FIG. 5). For example, for the read level RD1, the first best read offset is −130 mV, and the last best read offset is −60 mV with respect to the default voltage V1.

Each row of best read offsets can correspond to a memory cell condition which causes a set of memory cells under such condition to have or show the respective best read offset. For example, the condition can be a combination of multiple factors. The factors can include workload type, environmental temperature, retention age, read disturbance, cross temperature, first read issue, fabrication process, and the like. Different conditions can correspond to different factor values. For example, a set memory cells can be put into a condition in an experimental environment. A best read offset can be measured from these memory cells. In some embodiments, the conditions under consideration can be a set of extreme conditions associated with worst-case scenarios. Thus, some of the best read offsets can each represent a maximum variation of a best read offset under an extreme condition.

The table 1120 shows optimized coarse search ranges derived based on the best read offsets collected in the table 1110. As shown, corresponding to each read level (RD1, RD2, and RD3), the minimum value among the respective column of best read offsets is used as a lower limit offset, while the maximum value among the respective column of best read offsets is used as an upper limit offset. The lower limit offset and the upper limit offset together can define an optimized coarse search range for the respective read level with respect to the respective default voltage. For example, the lower boundary voltage of the optimized coarse search range is the default voltage plus the lower limit offset. The upper boundary voltage of the optimized coarse search range is the default voltage plus the upper limit offset.

In table 1120, the offsets in the first, second, and third columns can each be used for a coarse search at the read level RD1, RD2, and RD3, respectively. Other upper and lower limit offsets for other read levels can be derived similarly, if desired.

Figure 11B:
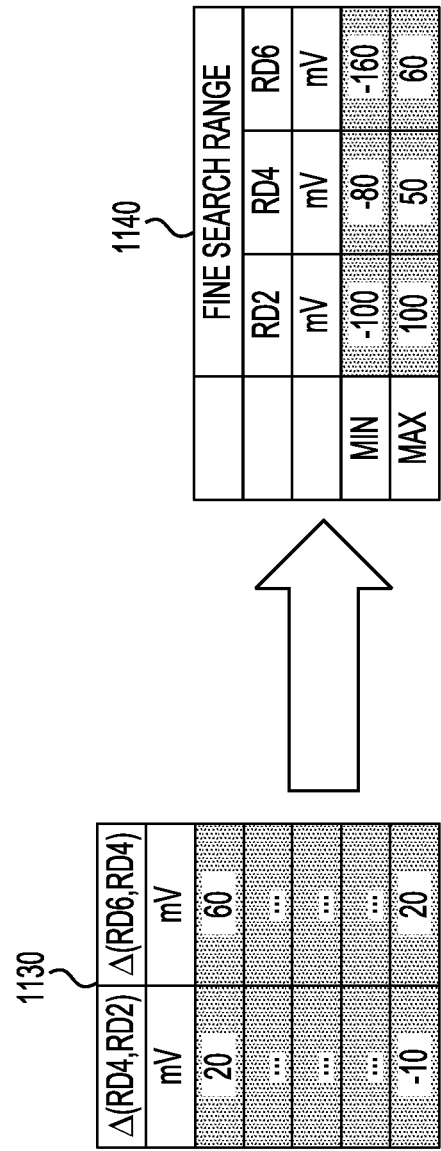
FIG. 11B shows two tables 1130 and 1140 for illustrating how to optimize the scan range used for a fine search in the BCD-based search process 1000 according to embodiments of the disclosure.

FIG. 11B shows two tables 1130 and 1140 for illustrating how to optimize the scan range used for a fine search in the BCD-based search process 1000 according to embodiments of the disclosure. The table 1130 includes an equal number of rows of values as the rows of best read offsets in table 1110. The first column of Table 1130 includes a list of best read offset differences between tween the columns RD2 and RD4. Each such a best read offset difference can be a difference between two best offset values in the same row but in different columns RD2 and RD4 in the table 1110. For example, considering the last row of the table 1110, the difference between the values of columns RD2 and RD4 is −40 mV−(−30) mV=−10 mV (the value of a higher read level minus the value of a lower level). Similarly, the second column of Table 1130 includes a list of best read offset differences between the columns RD4 and RD4.

The table 1140 shows optimized fine search ranges for the read levels RD4 and RD6. The optimized search ranges can be derived based on the best read offset differences in the table 1130. Specifically, for the fine search range of RD4 in the table 1140, a lower limit offset, −80 mV, can be the minimum of the listed best read offset differences in the first column of the table 1130, and an upper limit offset, 50 mV, can be the maximum of the listed best read offset differences in the first column of the table 1130. These lower and upper limit offsets can be offsets with respect to an anchor voltage when being used in a fine search process. For example, the anchor voltage for RD4 can have an anchor offset with respect to the default voltage of RD4. The anchor offset can be equal to a fine best read offset of the read level RD2. The fine best read offset of RD2 can be found, for example, in the optimized coarse search range {−190 mV, 70 mV} of RD2 indicated in the table 1120. It is possible that two rounds of searches (a coarse search and a fine search) are performed for finding the fine best read of set of RD2, such as in the example of FIGS. 10A-10B.

Similarly, for the fine search range of RD6 in the table 1140, a lower limit offset, −160 mV, can be the minimum of the listed best read offset differences in the second column of the table 1130, and an upper limit offset, 60 mV, can be the maximum of the listed best read offset differences in the second column of the table 1130. These lower and upper limit offsets can be offsets with respect to an anchor voltage for RD6. The anchor voltage for RD6 can have an anchor offset with respect to the respective default voltage of RD6. The anchor offset of RD6 can be equal to a fine best read offset of the read level RD4. The fine best read offset of RD4 can be found, for example, in the optimized fine search range {−80 mV, 50 mV} of RD2 indicated in the table 1140. Table 1140 also lists a fine search range {−100 mV, 100 mV} for RD2. This fine search range can be set based on any other methods.

In the above description, a combination of a coarse search and a fine search is first performed in the coarse search range of RD2 in table 1120 to find the fine best read offset of RD2. Using the fine best read offset of RD2 as an anchor offset, a fine search is performed in the fine search range of RD4 in table 1140 to find the fine best read offset of RD4. The fine best read offset of RD4 is used as an anchor offset, a fine search range of RD6 can be determined with the fine search range of RD6 in table 1140. In this way, three best read offset can be determined for read levels RD2, RD4, and RD6 and used for reading a middle page in the FIG. 5 example.

In other examples, the above order (from RD2 to RD6) may be changed to any order. For example, the above search may take any order, such as the order of RD6, RD2, and RD4. A combination of a coarse search and a fine search may start from RD6 followed by two fine searches at RD2 and RD4. In this order, the coarse search range and the fine search ranges of corresponding levels can accordingly be adjusted. For example, a fine best offset of RD6 can be used as an anchor offset of RD2. Accordingly, a fine search range of RD2 can be determined based on best read offset differences between the best read offsets of RD2 and RD6. Also, the fine best offset of RD6 can be used as an anchor offset of RD4. Alternatively, a fine best offset of RD2 is used as an anchor offset of RD4.

The above descriptions uses middle page read levels RD2, RD4, and RD6 of TLCs as examples for explaining the coarse or fine search range optimization method. However, the search optimization method can be used for any type of MLCs with one, two, three, four, or more pages stored therein.

Compared with blindly setting a sear range, a search range (or scan range) obtained using the search range optimization method disclosed herein can be shorter thus accelerating a best read level search process. Also, when the search range optimization method disclosed herein is employed, some coarse search processes can be skipped, further accelerating the best read level search process. Further, the search range optimization method disclosed herein does not rely on a specific search method. The search range optimization method can be employed to provide optimized search ranges for any best read search methods.

Figure 12A:
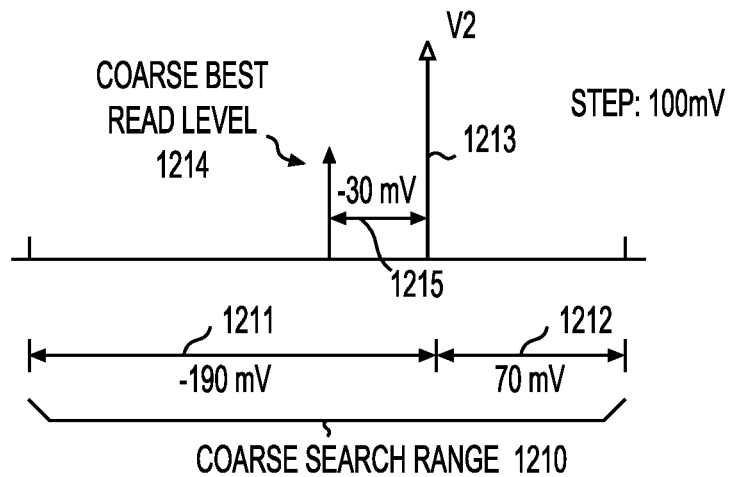
FIGS. 12A-12C show a best read level search process according to embodiments of the disclosure.
Figure 12B:
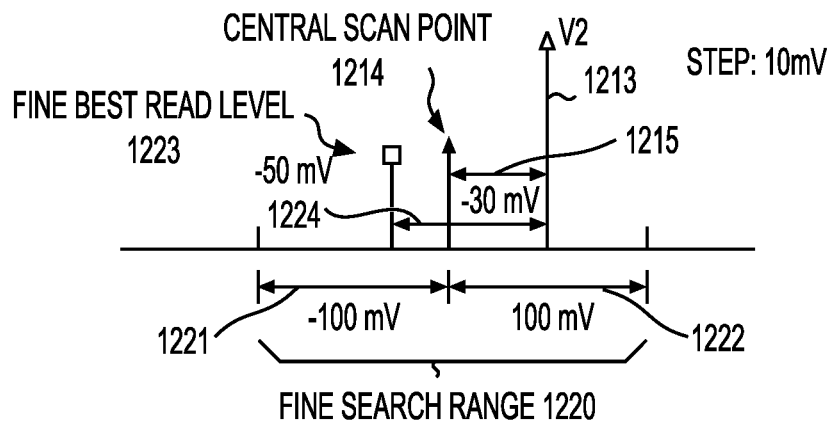
Figure 12C:
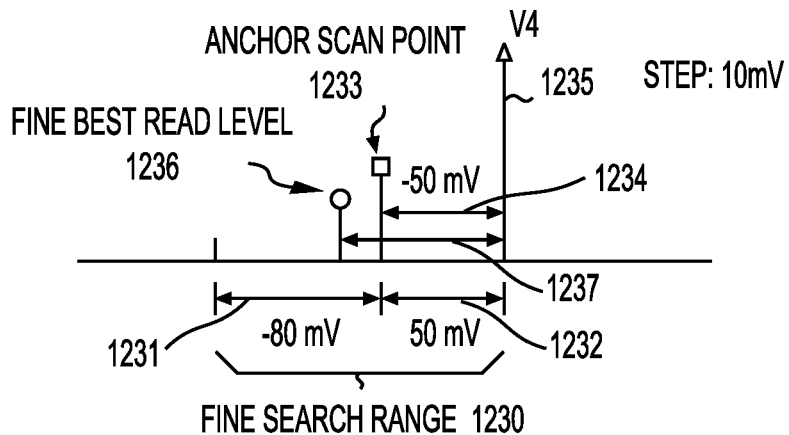

FIGS. 12A-12C show a best read level search process according to embodiments of the disclosure. Best read levels corresponding default voltages V2 and V4 for reading a middle page from TLCs can be determined during the process. Optimized coarse and fine search ranges are used during the process.

FIG. 12A shows a coarse search range 1210. The coarse search range 1210 has an upper limit offset 1211, 70 mV, and a lower limit offset 1211, −190 mV, with respect to the default voltage V2 1213. The coarse search range 1210 can be an optimized coarse search range determined using the coarse search range optimization method described in the example of FIGS. 11A-11B. A coarse search with a step voltage of 100 mV can be performed over the coarse search range 1210 to find a coarse best read level 1214 having a coarse best read offset 1215, −30 mV, with respect to the default voltage V2 1213.

FIG. 12B shows a fine search range 1220 defined with the coarse best read level 1214 as a central scan point 1214. The fine search range 1220 can have a lower limit offset 1221, −100 mV, and an upper limit offset 1222, 100 mV, with respect to the central scan point 1214. Follow the coarse search at FIG. 12A, a fine search with a step voltage of 10 mV can be performed over the fine search range 1220 to find a fine best read level 1223. The fine best read level can have a fine best read offset 1224, −50 mV, with respect to the default voltage V2 1213.

FIG. 12C shows another fine search range 1230 for a read level corresponding to the default voltage V4 1235. The fine search range 1230 can be defined based on an anchor scan point (anchor voltage) 1233. The anchor scan point 1233 can have a same offset value as the fine best read offset 1224, −50 mV, but with respect to the default voltage V4 1235. The fine search range 1230 can have a lower limit offset 1231, −80 mV, and an upper limit offset 1232, 50 mV, with respect to the anchor scan point 1233. Followed the fine search at FIG. 12B, another fine search can be performed over the fine search range 1230 with a voltage step of 10 mV to find a best read level 1236. The best read level 1236 can have a best read offset 1237 with respect to the default voltage V4.

Figure 13:
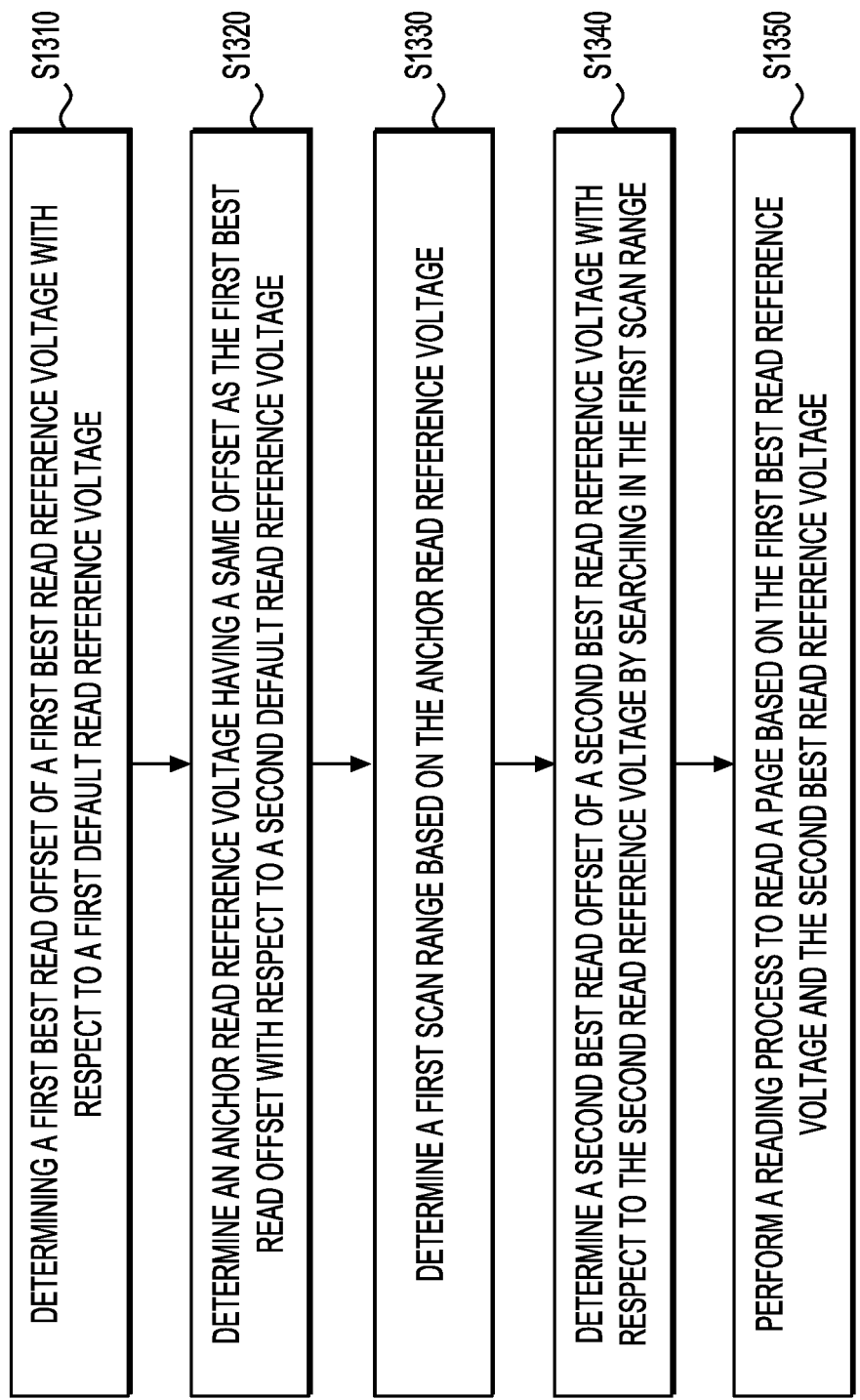
FIG. 13 shows a best read level search process 1300 according to embodiments of the disclosure.

FIG. 13 shows a best read level search process 1300 according to embodiments of the disclosure. The process 1300 can start from S1310.

At S1310, a first best read offset of a first best read reference voltage with respect to a first default read reference voltage can be determined. For example, to determine the first best read offset, a second scan range can be determined. The second scan range can have an upper limit that is the first default read reference voltage plus an upper limit offset and a lower limit that is the first default read reference voltage plus a lower limit offset. The second scan range can be scanned based on a coarse step voltage by performing a series of first single read operations within the second scan range. Each first single read operation generates a bit count of either 1 or 0. Each first single read operation corresponding to a first read reference voltage.

For example, for each first single read operation, a first bit count difference between the bit counts of the respective first single read operation and the previous first single read operation, if available, can be determined. A second bit count difference between the bit counts of the respective first single read operation and the subsequent first single read operation, if available, can be determined. The first read reference voltage of the first single read operation, of which a sum of the respective first bit count difference and the respective second bit count difference has a minimum value among the series of first single read operations, can be determined to be a coarse best read reference voltage.

In an example, when there are more than one first single read operations, of which sums of the respective first bit count differences and the respective second bit count differences have a same value, the first read reference voltage of the first single read operation, of which a minimum of the respective first bit count difference and the respective second bit count difference has a minimum value among the more than one first single read operations, can be determined to be the coarse best read reference voltage.

In some examples, a third scan range can subsequently be determined. The third scan range can have an upper limit that is the coarse best read reference voltage plus the coarse step voltage and a lower limit that is the coarse best read reference voltage minus the coarse step voltage. The third scan range can be scanned based on a fine step voltage by performing a series of second single read operations within the third scan range. Each second single read operation corresponds to a second read reference voltage. Each second single read operation generates a bit count of either 1 or 0.

For each second single read operation, a first bit count difference between the bit counts of the respective second single read operation and the prior second single read operation, if available, can be determined. Also, a second bit count difference between the bit counts of the respective second single read operation and the subsequent second single read operation, if available, can be determined. Accordingly, the second read reference voltage of the second single read operation, of which a sum of the respective first bit count difference and the respective second bit count difference has a minimum value among the series of the second single read operations, can be determined to be the first best read reference voltage. An offset of the first best read reference voltage with respect to the first default read reference voltage is the first best read offset.

At S1320, an anchor read reference voltage having a same offset as the first best read offset but with respect to a second default read reference voltage can be determined. The first default read reference voltage and the second default read reference voltage are set for reading a page from a set of MLCs in a semiconductor memory device.

At S1330, a first scan range can be determined based on the anchor read reference voltage. For example, an upper limit of the first scan range is the anchor read reference voltage plus an upper limit offset. A lower limit of the first scan range is the anchor read reference voltage plus a lower limit offset. The upper limit offset and the lower limit offset can be a positive voltage value or a negative voltage value.

At S1340, a second best read offset of a second best read reference voltage with respect to the second default read reference voltage can be determined by searching in the first scan range. For example, the first scan range can be scanned by performing a series of third single read operations within the first scan range. Each third single read operation corresponds to a third read reference voltage. Each third single read operation generates a bit count of either 1 or 0.

For each third single read operation, a first bit count difference between the bit counts of the respective third single read operation and the prior third single read operation, if available, can be determined. A second bit count difference between the bit counts of the respective third single read operation and the subsequent third single read operation, if available, can be determined. Accordingly, the third read reference voltage of the third single read operation, of which a sum of the respective first bit count difference and the respective second bit count difference has a minimum value among the series of the third single read operations, can be determined to be the second best read reference voltage. An offset of the second best read reference voltage with respect to the second default read reference voltage is the second best read offset. In some examples, the first, second, and third single read operations are partial page read operations.

At S1350, a reading process can be performed to read the page from the set of MLCs based on the first best read reference voltage and the second best read reference voltage. The process 1300 can terminate.

Figure 14A:
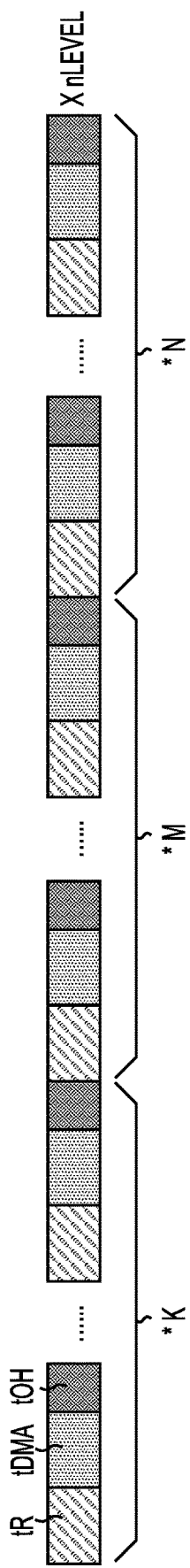
FIGS. 14A-14B show a comparison of performance between a first best read search process and a second best read search process according to embodiments of the disclosure.
Figure 14B:
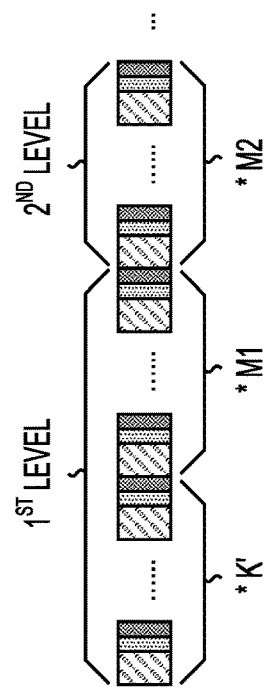

FIGS. 14A-14B show a comparison of performance between a first best read search process and a second best read search process according to embodiments of the disclosure. The first best read search process can be an FBC-based best read level search process, such as in the FIG. 8 example. The second best read search process can be a BCD-based best read level search process, such as the processes in the examples of FIGS. 9-13.

FIG. 14A shows a total time for completing the first best read level search process over a word-line memory cell string. The word-line memory cell string can include MLCs having (n+1) states. Accordingly, there are n read levels to be processed. The total time, denoted T, can be:

$$T = SUM\ (K, M, N) * (tR + tDMA + tOH) * nLevel. \quad (1)$$

In expression (1), nLevel represents the number read levels to be processed. K, M, and N each represent a number of scan steps performed during a coarse scan, a first fine scan, and a second fine scan, respectively, when processing each read level. The time for each scan step includes a page read time, tR, a data transmission time (for example, between a memory device and a memory controller), tDMA, and a firmware (FW) processing overhead time, tOH.

FIG. 14B shows a total time for completing the second best read level search process over a word-line memory cell string. The word line memory cell string can also include MLCs having (n+1) states. However, the number of to-be-processed read levels is less than n. For example, for reading a middle page of TLCs, the search process can be performed at three read levels (RD2, RD4, and RD4, for example). Accordingly, the total time, denoted T', can be:

$$T' = K' * (tR' + tDMA' + tOH') + \sum M[i] * (tR' + tDMA' + tOH'). \quad (2)$$

In expression (2), K' represents a number of scan steps performed during a coarse scan at a first read level among the to-be-processed read levels. M'[i] represents a number of scan steps performed during a fine scan of each read level indexed by i. The time for each scan step includes a single-read-operation time, tR', a data transmission time (for example, between a memory device and a memory controller), tDMA', and a firmware (FW) processing overhead time, tOH'.

Comparing the FIG. 14B example with the FIG. 14A example, the reading time tR' can be smaller than tR' because single read operations can be used in place of normal page read operations. Data transmission time tDMA' can be smaller than tDMA, because partial-page read can be used in place of full-page read and the amount of to-be-transmitted data is reduced. FW processing overhead tOH' can be smaller than tOH, because bit counts (at each scan step) in the second search method can have hardware accelerate support while FBCs (comparison between read bits and original bits) may be performed using FW. The numbers of scan steps K' and M'[i] can also be reduced from K and M because employment of search range optimization techniques. The second fine search is removed from the second search method, thus N does not appear in the expression (2). Also, as shown in FIG. 14B, the coarse scan (including K' scan steps) only takes place in the first read level. Other read levels each only include a fine scan. Sipping the coarse scans can also save time.

In various embodiments, the best read level search methods disclosed herein can be implemented at a memory controller (such as the memory controller 106), or at a memory device (such as the memory device 104). These methods can be triggered in response to an ECC decode failure or can be run in background. In some embodiments, the methods disclosed herein can be implemented with hardware, software, or a combination thereof. In an example, a best read level search method disclosed herein can be implemented with instructions stored in a non-transitory computer-readable medium. A processor or processing circuitry can execute the instructions to perform the respective method.

Aspects of the disclosure provide a memory controller implementing the techniques disclosed herein. For example, the memory controller can include circuitry configured to perform a method. The method can include determining a first best read offset of a first best read reference voltage with respect to a first default read reference voltage; determining an anchor read reference voltage having a same offset as the first best read offset with respect to a second default read reference voltage, wherein the first default read reference voltage and the second default read reference voltage are set for reading a page from a set of multi-level cells (MLCs) in a semiconductor memory device in the memory system; determining a first scan range based on the anchor read reference voltage, wherein an upper limit of the first scan range is the anchor read reference voltage plus an upper limit offset, and a lower limit of the first scan range is the anchor read reference voltage plus a lower limit offset, the upper limit offset and the lower limit offset being a positive voltage value or a negative voltage value; determining a second best read offset of a second best read reference voltage with respect to the second read reference voltage by searching in the first scan range; and performing a reading process to read the page from the set of MLCs based on the first best read reference voltage and the second best read reference voltage.

Aspects of the disclosure provide a non-transitory computer-readable medium storing instructions that implement the techniques disclosed herein. For example, the instructions, when executed by a processor (or processing circuitry), can cause the processor (or the processing circuitry) to perform a method. The method can include determining a first best read offset of a first best read reference voltage with respect to a first default read reference voltage; determining an anchor read reference voltage having a same offset as the first best read offset with respect to a second default read reference voltage, wherein the first default read reference voltage and the second default read reference voltage are set for reading a page from a set of multi-level cells (MLCs) in a semiconductor memory device in the memory system; determining a first scan range based on the anchor read reference voltage, wherein an upper limit of the first scan range is the anchor read reference voltage plus an upper limit offset, and a lower limit of the first scan range is the anchor read reference voltage plus a lower limit offset, the upper limit offset and the lower limit offset being a positive voltage value or a negative voltage value; determining a second best read offset of a second best read reference voltage with respect to the second read reference voltage by searching in the first scan range; and performing a reading process to read the page from the set of MLCs based on the first best read reference voltage and the second best read reference voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of a memory system, comprising:
    determining a first best read offset of a first best read reference voltage with respect to a first default read reference voltage;
    determining an anchor read reference voltage having a same offset as the first best read offset with respect to a second default read reference voltage, wherein the first default read reference voltage and the second default read reference voltage are set for reading a page from a set of multi-level cells (MLCs) in a semiconductor memory device in the memory system;
    determining a first scan range based on the anchor read reference voltage, wherein an upper limit of the first scan range is the anchor read reference voltage plus an upper limit offset, and a lower limit of the first scan range is the anchor read reference voltage plus a lower limit offset, the upper limit offset and the lower limit offset being a positive voltage value or a negative voltage value; and
    determining a second best read offset of a second best read reference voltage with respect to the second read reference voltage based on the first scan range.

2. The method of claim 1, wherein the determining the first best read offset includes:
    determining a second scan range, the second scan range having an upper limit that is the first default read reference voltage plus an upper limit offset and a lower limit that is the first default read reference voltage plus a lower limit offset;
    scanning the second scan range based on a coarse step voltage by performing a series of first single read operations within the second scan range, each first single read operation corresponding to a first read reference voltage, each first single read operation generating a bit count of either 1 or 0;
    for each first single read operation, determining:
        a first bit count difference between the bit counts of the respective first single read operation and the previous first single read operation, if available, and
        a second bit count difference between the bit counts of the respective first single read operation and the subsequent first single read operation, if available; and
    determining the first read reference voltage of the first single read operation, of which a sum of the respective first bit count difference and the respective second bit count difference has a minimum value among the series of first single read operations, to be a coarse best read reference voltage.

3. The method of claim 2, further comprising:
    when there are more than one first single read operations, of which sums of the respective first bit count differences and the respective second bit count differences have a same value, determining the first read reference voltage of the first single read operation, of which a minimum of the respective first bit count difference and the respective second bit count difference has a minimum value among the more than one first single read operations, to be the coarse best read reference voltage.

4. The method of claim 2, further comprising:
    determining a third scan range, the third scan range having an upper limit that is the coarse best read reference voltage plus the coarse step voltage and a lower limit that is the coarse best read reference voltage minus the coarse step voltage; and
    scanning the third scan range based on a fine step voltage by performing a series of second single read operations within the third scan range, each second single read operation corresponding to a second read reference voltage, each second single read operation generating a bit count of either 1 or 0;
    for each second single read operation, determining:
        a first bit count difference between the bit counts of the respective second single read operation and the prior second single read operation, if available, and
        a second bit count difference between the bit counts of the respective second single read operation and the subsequent second single read operation, if available; and
    determining the second read reference voltage of the second single read operation, of which a sum of the respective first bit count difference and the respective second bit count difference has a minimum value among the series of the second single read operations, to be the first best read reference voltage, an offset of the first best read reference voltage with respect to the first default read reference voltage being the first best read offset.

5. The method of claim 4, wherein the determining the second best read offset of the second best read reference voltage with respect to the second default read reference voltage based on the first scan range includes:
scanning the first scan range by performing a series of third single read operations within the first scan range, each third single read operation corresponding to a third read reference voltage, each third single read operation generating a bit count of either 1 or 0;
for each third single read operation, determining:
 a first bit count difference between the bit counts of the respective third single read operation and the prior third single read operation, if available, and
 a second bit count difference between the bit counts of the respective third single read operation and the subsequent third single read operation, if available; and
determining the third read reference voltage of the third single read operation, of which a sum of the respective first bit count difference and the respective second bit count difference has a minimum value among the series of third single read operations, to be the second best read reference voltage, an offset of the second best read reference voltage with respect to the second default read reference voltage being the second best read offset.

6. The method of claim 5, wherein the first, second, and third single read operations are partial page read operations.

7. The method of claim 2, further comprising:
collecting a first set of first best read offsets, each first best read offset being a voltage shift of a best read reference voltage from the first default read reference voltage, each first best read offset corresponding to a memory cell condition that causes a set of memory cells under such memory cell condition to have the respective first best read offset, the first set of the first best read offsets each having a positive value or a negative value;
setting a maximum value of the first set of the first best read offsets to be the upper limit offset of the second scan range; and
setting a minimum value of the first set of the first best read offsets to be the lower limit offset of the second scan range.

8. The method of claim 7, further comprising:
collecting a second set of second best read offsets, each second best read offset corresponding to one of the first set of the first best read voltages and the respective memory cell condition, each second best read offset being a voltage shift of a best read reference voltage from the second default read reference voltage, the second set of the second best read offsets each having a positive value or a negative value;
determining a difference between each pair of the first best read offset and the respective second best read offset, the difference being equal to the respective second best read offset minus the respective first best read offset;
setting a maximum value of the differences between each pair of the first best read offset and the respective second best read offset to be the upper limit offset of the first scan range; and
setting a minimum value of the differences between each pair of the first best read offset and the respective second best read offset to be the lower limit offset of the first scan range.

9. The method of claim 1, further comprising:
determining an error correction code (ECC) decoding process is failed for reading the page before the determining the first best read offset of the first best read reference voltage with respect to the first default read reference voltage.

10. The method of claim 1, further comprising:
performing an ECC soft decoding process to read the page from the set of MLCs based on the first best read reference voltage and the second best read reference voltage.

11. The method of claim 1, wherein the first or second default read reference voltage corresponds to default read reference voltage of the MLCs.

12. A memory system, comprising:
a semiconductor memory device; and
a memory controller comprising circuitry configured to:
 determine a first best read offset of a first best read reference voltage with respect to a first default read reference voltage;
 determine an anchor read reference voltage having a same offset as the first best read offset with respect to a second default read reference voltage, wherein the first default read reference voltage and the second default read reference voltage are set for reading a page from a set of multi-level cells (MLCs) in the semiconductor memory device;
 determine a first scan range based on the anchor read reference voltage, wherein an upper limit of the first scan range is the anchor read reference voltage plus an upper limit offset, and a lower limit of the first scan range is the anchor read reference voltage plus a lower limit offset, the upper limit offset and the lower limit offset being a positive voltage value or a negative voltage value; and
 determine a second best read offset of a second best read reference voltage with respect to the second read reference voltage based on the first scan range.

13. The memory system of claim 12, wherein the circuitry is further configured to:
determine a second scan range, the second scan range having an upper limit that is the first default read reference voltage plus an upper limit offset and a lower limit that is the first default read reference voltage plus a lower limit offset;
scan the second scan range based on a coarse step voltage by performing a series of first single read operations within the second scan range, each first single read operation corresponding to a first read reference voltage, each first single read operation generating a bit count of either 1 or 0;
for each first single read operation, determine:
 a first bit count difference between the bit counts of the respective first single read operation and the previous first single read operation, if available, and
 a second bit count difference between the bit counts of the respective first single read operation and the subsequent first single read operation, if available; and
determine the first read reference voltage of the first single read operation, of which a sum of the respective first bit count difference and the respective second bit count difference has a minimum value among the series of first single read operations, to be a coarse best read reference voltage.

14. The memory system of claim 13, wherein the circuitry is further configured to:

when there are more than one first single read operations, of which sums of the respective first bit count differences and the respective second bit count differences have a same value, determine the first read reference voltage of the first single read operation, of which a minimum of the respective first bit count difference and the respective second bit count difference has a minimum value among the more than one first single read operations, to be the coarse best read reference voltage.

15. The memory system of claim 13, wherein the circuitry is further configured to:
   determine a third scan range, the third scan range having an upper limit that is the coarse best read reference voltage plus the coarse step voltage and a lower limit that is the coarse best read reference voltage minus the coarse step voltage; and
   scan the third scan range based on a fine step voltage by performing a series of second single read operations within the third scan range, each second single read operation corresponding to a second read reference voltage, each second single read operation generating a bit count of either 1 or 0;
   for each second single read operation, determine:
      a first bit count difference between the bit counts of the respective second single read operation and the prior second single read operation, if available, and
      a second bit count difference between the bit counts of the respective second single read operation and the subsequent second single read operation, if available; and
   determine the second read reference voltage of the second single read operation, of which a sum of the respective first bit count difference and the respective second bit count difference has a minimum value among the series of the second single read operations, to be the first best read reference voltage, an offset of the first best read reference voltage with respect to the first default read reference voltage being the first best read offset.

16. A non-transitory computer-readable medium storing instructions that, when executed by a processor, cause the processor to perform a method, the method comprising:
   determining a first best read offset of a first best read reference voltage with respect to a first default read reference voltage;
   determining an anchor read reference voltage having a same offset as the first best read offset with respect to a second default read reference voltage, wherein the first default read reference voltage and the second default read reference voltage are set for reading a page from a set of multi-level cells (MLCs) in a semiconductor memory device;
   determining a first scan range based on the anchor read reference voltage, wherein an upper limit of the first scan range is the anchor read reference voltage plus an upper limit offset, and a lower limit of the first scan range is the anchor read reference voltage plus a lower limit offset, the upper limit offset and the lower limit offset being a positive voltage value or a negative voltage value; and
   determining a second best read offset of a second best read reference voltage with respect to the second read reference voltage based on the first scan range.

17. The non-transitory computer-readable medium of claim 16, wherein the determining the first best read offset includes:
   determining a second scan range, the second scan range having an upper limit that is the first default read reference voltage plus an upper limit offset and a lower limit that is the first default read reference voltage plus a lower limit offset;
   scanning the second scan range based on a coarse step voltage by performing a series of first single read operations within the second scan range, each first single read operation corresponding to a first read reference voltage, each first single read operation generating a bit count of either 1 or 0;
   for each first single read operation, determining:
      a first bit count difference between the bit counts of the respective first single read operation and the previous first single read operation, if available, and
      a second bit count difference between the bit counts of the respective first single read operation and the subsequent first single read operation, if available; and
   determining the first read reference voltage of the first single read operation, of which a sum of the respective first bit count difference and the respective second bit count difference has a minimum value among the series of first single read operations, to be a coarse best read reference voltage.

18. The non-transitory computer-readable medium of claim 17, wherein the method further comprises:
   when there are more than one first single read operations, of which sums of the respective first bit count differences and the respective second bit count differences have a same value, determining the first read reference voltage of the first single read operation, of which a minimum of the respective first bit count difference and the respective second bit count difference has a minimum value among the more than one first single read operations, to be the coarse best read reference voltage.

19. The non-transitory computer-readable medium of claim 17, wherein the method further comprises:
   determining a third scan range, the third scan range having an upper limit that is the coarse best read reference voltage plus the coarse step voltage and a lower limit that is the coarse best read reference voltage minus the coarse step voltage; and
   scanning the third scan range based on a fine step voltage by performing a series of second single read operations within the third scan range, each second single read operation corresponding to a second read reference voltage, each second single read operation generating a bit count of either 1 or 0;
   for each second single read operation, determining:
      a first bit count difference between the bit counts of the respective second single read operation and the prior second single read operation, if available, and
      a second bit count difference between the bit counts of the respective second single read operation and the subsequent second single read operation, if available; and
   determining the second read reference voltage of the second single read operation, of which a sum of the respective first bit count difference and the respective second bit count difference has a minimum value among the series of the second single read operations, to be the first best read reference voltage, an offset of the first best read reference voltage with respect to the first default read reference voltage being the first best read offset.

20. The non-transitory computer-readable medium of claim 19, wherein the determining the second best read offset of the second best read reference voltage with respect to the second default read reference voltage based on the first scan range includes:
- scanning the first scan range by performing a series of third single read operations within the first scan range, each third single read operation corresponding to a third read reference voltage, each third single read operation generating a bit count of either 1 or 0;
- for each third single read operation, determining:
  - a first bit count difference between the bit counts of the respective third single read operation and the prior third single read operation, if available, and
  - a second bit count difference between the bit counts of the respective third single read operation and the subsequent third single read operation, if available; and
- determining the third read reference voltage of the third single read operation, of which a sum of the respective first bit count difference and the respective second bit count difference has a minimum value among the series of third single read operations, to be the second best read reference voltage, an offset of the second best read reference voltage with respect to the second default read reference voltage being the second best read offset.

* * * * *